(12) United States Patent
Zhu et al.

(10) Patent No.: US 9,117,891 B2
(45) Date of Patent: Aug. 25, 2015

(54) COMPOUND SEMICONDUCTOR DEVICE AND METHOD FOR MANUFACTURING THE SAME

(71) Applicant: FUJITSU LIMITED, Kawasaki-shi, Kanagawa (JP)

(72) Inventors: Lei Zhu, Atsugi (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/948,422

(22) Filed: Jul. 23, 2013

(65) Prior Publication Data

US 2014/0084344 A1    Mar. 27, 2014

(30) Foreign Application Priority Data

Sep. 21, 2012    (JP) .................................. 2012-208686

(51) Int. Cl.
| | |
|---|---|
| *H01L 29/778* | (2006.01) |
| *H01L 29/66* | (2006.01) |
| *H01L 29/04* | (2006.01) |
| *H01L 29/20* | (2006.01) |
| *H01L 21/02* | (2006.01) |

(52) U.S. Cl.
CPC ............ *H01L 29/778* (2013.01); *H01L 29/045* (2013.01); *H01L 29/66431* (2013.01); *H01L 29/66462* (2013.01); *H01L 29/7786* (2013.01); *H01L 21/0237* (2013.01); *H01L 21/0254* (2013.01); *H01L 21/0262* (2013.01); *H01L 21/02381* (2013.01); *H01L 21/02458* (2013.01); *H01L 21/02494* (2013.01); *H01L 29/2003* (2013.01)

(58) Field of Classification Search
CPC ............ H01L 29/66431; H01L 29/778; H01L 21/0237; H01L 21/02381; H01L 21/02458; H01L 21/02494; H01L 21/0254; H01L 21/0262; H01L 29/045; H01L 29/2003; H01L 29/66462; H01L 29/7786
See application file for complete search history.

(56) References Cited

U.S. PATENT DOCUMENTS

| | | | |
|---|---|---|---|
| 2009/0152530 | A1 | 6/2009 | Ahn et al. |
| 2010/0264461 | A1* | 10/2010 | Rajan et al. .................... 257/194 |
| 2012/0187452 | A1* | 7/2012 | Saito et al. ..................... 257/192 |

(Continued)

FOREIGN PATENT DOCUMENTS

| | | |
|---|---|---|
| JP | 2010-263011 A1 | 11/2010 |
| JP | 2010263011 A  * | 11/2010 |

OTHER PUBLICATIONS

An English machine translation of JP 2010263011 A.*

(Continued)

*Primary Examiner* — Khaja Ahmad
(74) *Attorney, Agent, or Firm* — Kratz, Quintos & Hanson, LLP

(57) ABSTRACT

A compound semiconductor device includes: an electron transit layer formed of a compound semiconductor; and an electrode formed so as to overlie the electron transit layer with an insulating film interposed between the electron transit layer and the electrode, wherein part of the electron transit layer below the electrode are formed such that a first compound semiconductor having a first polar face and a second compound semiconductor having a second polar face are alternately arranged, and polarization charges in the first polar face have opposite polarity to polarization charges in the second polar face.

10 Claims, 27 Drawing Sheets

(56) References Cited

U.S. PATENT DOCUMENTS

2012/0220089 A1    8/2012  Imada et al.
2013/0082360 A1*   4/2013  Miyajima et al. ............. 257/628
2013/0292683 A1*  11/2013  Shah .............................. 257/76

OTHER PUBLICATIONS

O. Ambacher, et al.; "Two-dimensional electron gases induced by spontaneous and piezoelectric polarization charges in N- and Ga-face AlGaN/GaN hererostructures;" Journal of Applied Physics; vol. 85, No. 6; Mar. 15, 1999; pp. 3222-3233 and cover sheet (13 Sheets)/p. 2 of specification.

K. Matocha, et al.; "Positive Flatband Voltage Shift in MOS Capacitors on n-Type GaN;" IEEE Electron Device Letters; vol. 23; No. 2; Feb. 2002; pp. 79-81 (3 Sheets)/p. 2 of specification.

Office Action of Taiwanese Patent Application No. 102126661 dated Feb. 13, 2015 with English Summary of TWOA based on cited reference.

* cited by examiner

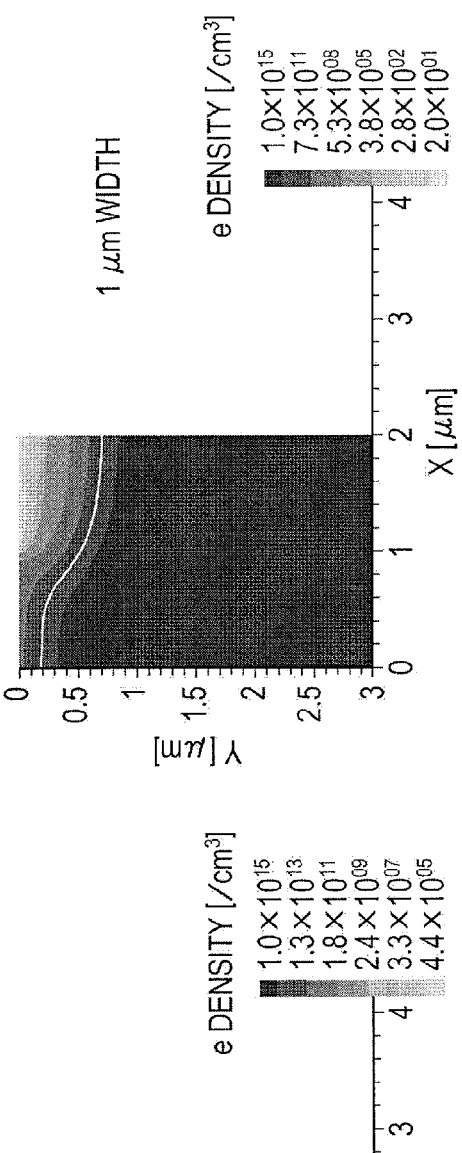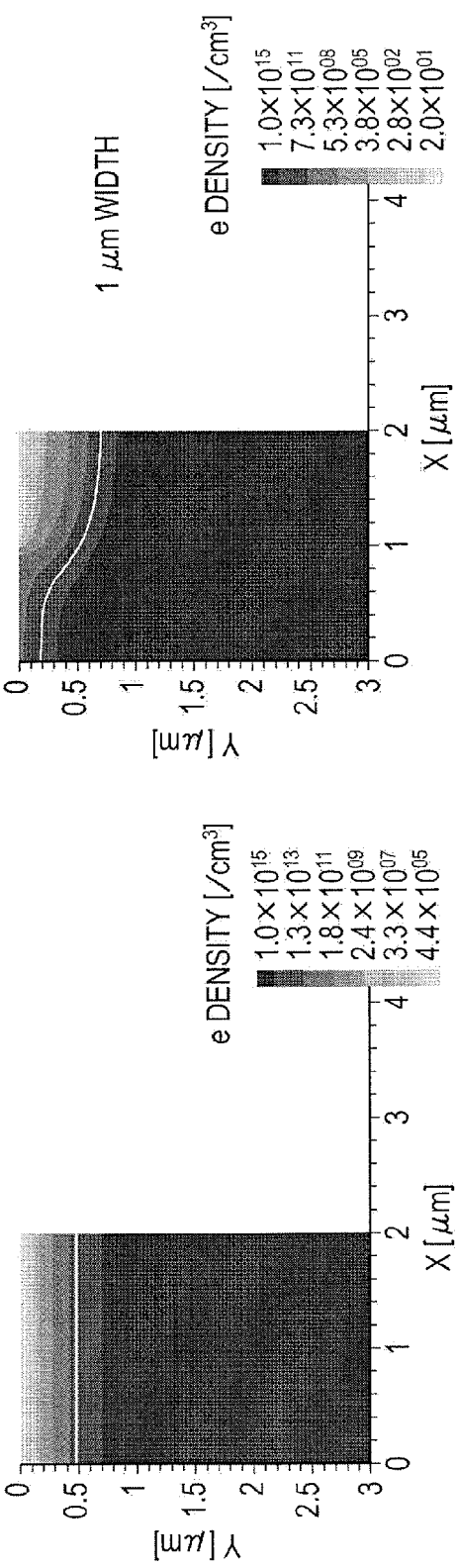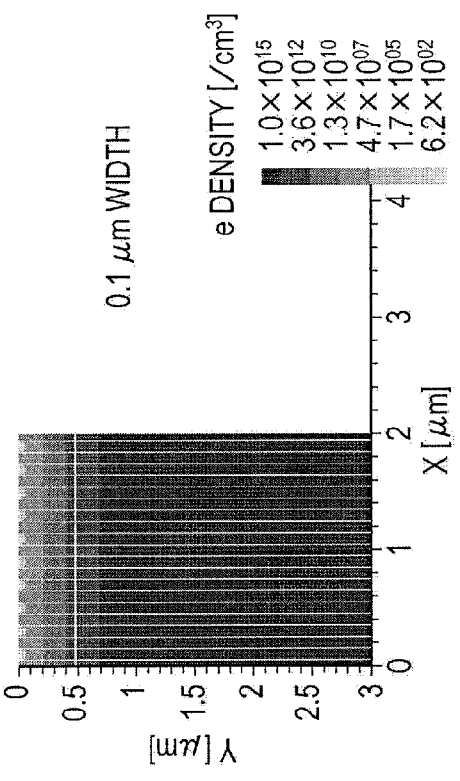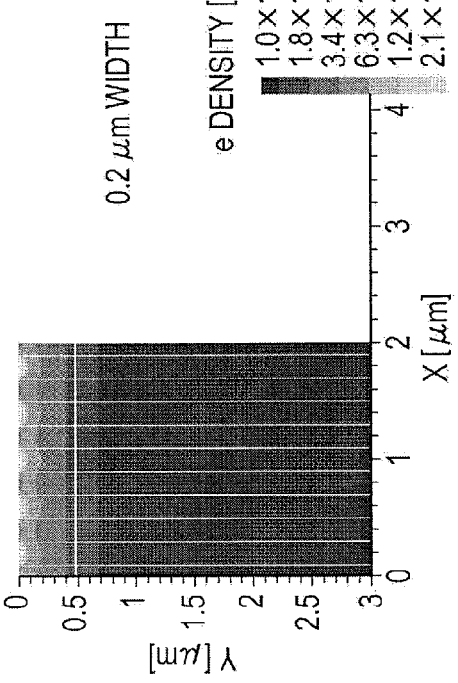
FIG. 7A RELATED ART
FIG. 7B
FIG. 7C
FIG. 7D

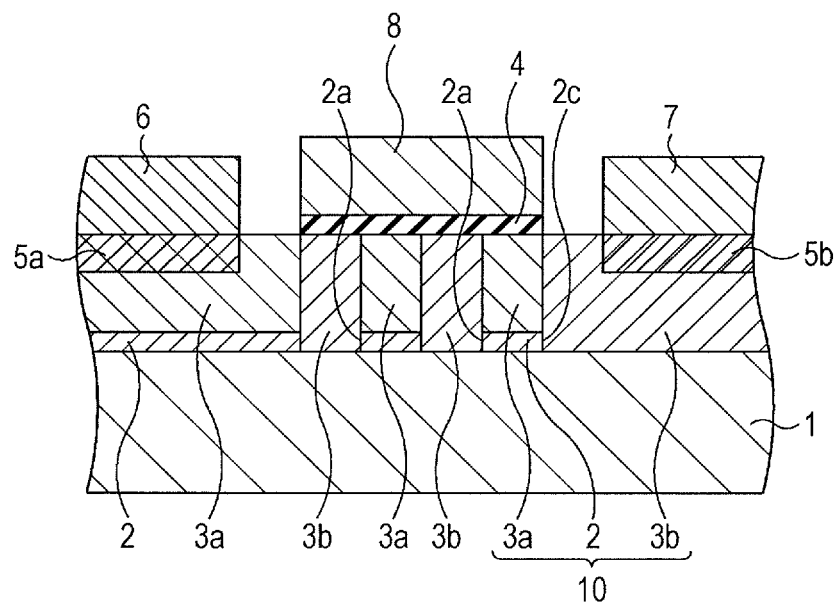
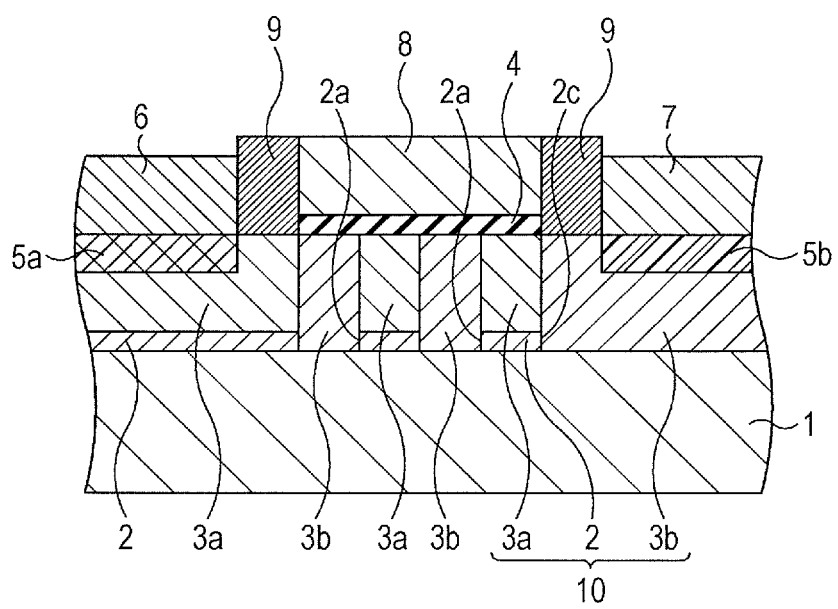

COMPOUND SEMICONDUCTOR DEVICE AND METHOD FOR MANUFACTURING THE SAME

CROSS-REFERENCE TO RELATED APPLICATION(S)

This application is based upon and claims the benefit of priority of the prior Japanese Patent Application No. 2012-208686, filed on Sep. 21, 2012, the entire contents of which are incorporated herein by reference.

FIELD

The embodiments discussed herein are related to a compound semiconductor device and a method for manufacturing the compound semiconductor device.

BACKGROUND

Since nitride semiconductors have characteristics such as exhibiting high saturation electron velocity and a wide band gap, application of nitride semiconductors to semiconductor devices having high breakdown voltage and high power has been studied on the basis of utilization of such characteristics. For example, the band gap of GaN that is a nitride semiconductor is 3.4 eV and larger than the band gap of Si (1.1 eV) and the band gap of GaAs (1.4 eV); thus, GaN exhibits high breakdown field strength. GaN is therefore a highly practical material used for power semiconductor devices which operate at high voltage and which output high power.

Semiconductor devices utilizing nitride semiconductors, such as field effect transistors, have been reported, in particular, high electron mobility transistors (HEMTs). Among HEMTs utilizing GaN (GaN-HEMTs), for instance, an AlGaN/GaN-HEMT in which GaN is used for an electron transit layer and in which AlGaN is used for an electron supply layer is attracting attention. In the AlGaN/GaN-HEMT, strain is generated in AlGaN owing to difference in the lattice constant between GaN and AlGaN. The strain causes piezoelectric polarization, and the piezoelectric polarization and the spontaneous polarization difference between AlGaN and GaN cause high-concentration two-dimensional electron gas (2DEG). The AlGaN/GaN-HEMT is therefore expected to be applied to highly efficient switching devices and to power devices having high breakdown voltage and used in, for example, electric vehicles.

Related art is disclosed in Japanese Laid-open Patent Publication No. 2010-263011; O. Ambacher, J. Smart, J. R. Shealy, N. G. Weimann, K. Chu, M. Murphy, W. J. Schaff, L. F. Eastman, R. Dimitrov, L. Wittmer, M. Stutzmann, W. Rieger, and J. Hilsenbeck, *Journal of Applied Physics*, 85, 3222, 1999; and K. Matocha, T. P. Chow, and R. J. Gutmann, *IEEE ELECTRON DEVICE LETTERS*, VOL. 23, p79, 2002.

In an AlGaN/GaN-HEMT, a number of electrons are present in a channel, and electric current therefore flows in the channel even in a state in which a gate voltage is not applied; in other words, this phenomenon is operation in a normally-on mode. In order to interrupt this flow of electric current, a negative voltage is applied to a gate electrode.

In order to use GaN-HEMTs as power devices having high breakdown voltage, in terms of fail safe, GaN-HEMTs desirably operate in a normally-off mode in which electric current does not flow in channels in a state in which a gate voltage is not applied.

A metal oxide semiconductor (MOS) GaN-HEMT has been developed as a GaN-HEMT which may operate in a normally-off mode; in particular, GaN is used for an electron transit layer, and a gate electrode is formed above the electron transit layer with a gate insulating film interposed there between them. In GaN-HEMTs, GaN is generally used to form an electron transit layer of which a surface (upper surface) is the Ga-face that is the c-plane (0001). In this case, negative spontaneous polarization charges are generated in the vicinity of the interface of the electron transit layer to the gate insulating film.

Such spontaneous polarization charges significantly vary with an increase in temperature. Existing GaN-HEMTs have a problem of high temperature dependence of a threshold voltage.

FIG. 1A illustrates the C-V characteristics of an example of existing GaN-MOS diodes, and FIG. 1B illustrates the relationship (Measured $V_{fb}$) between a flat band voltage and temperature and a theoretical curve (Ideal $V_{fb}$) in the example of existing GaN-MOS diodes. As is clear from FIG. 1A, C-V curves shift to the right side with an increase in temperature. This indicates that negative spontaneous polarization charges increase with an increase in temperature. As illustrated in FIG. 1B, although temperature dependence of flat band voltage is theoretically very weak, temperature dependence of negative spontaneous polarization charges significantly enhances temperature dependence of a flat band voltage, which is problematic.

SUMMARY

According to an aspect of the invention, a compound semiconductor device includes: an electron transit layer formed of a compound semiconductor; and an electrode formed so as to overlie the electron transit layer with an insulating film interposed between the electron transit layer and the electrode, wherein part of the electron transit layer below the electrode are formed such that a first compound semiconductor having a first polar face and a second compound semiconductor having a second polar face are alternately arranged, and polarization charges in the first polar face have opposite polarity to polarization charges in the second polar face.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 7A to 7D illustrate results of simulations for analyzing neutralization of spontaneous polarization charges in the case where the widths of a Ga-face GaN layer and an N-face GaN layer positioned below the gate electrode are changed;

FIGS. 18A and 18B are schematic cross-sectional views illustrating the subsequent processes for manufacturing the GaN-HEMT according to the third embodiment in sequence;

DESCRIPTION OF EMBODIMENTS

First Embodiment

A first embodiment discloses a GaN-HEMT that is a compound semiconductor device utilizing a nitride semiconductor. FIGS. 2A to 4B are schematic cross-sectional views illustrating processes for manufacturing the GaN-HEMT according to the first embodiment in sequence. FIGS. 5A and 5B are schematic plan views corresponding to FIG. 2C and FIG. 4B, respectively.

Figure 1A:
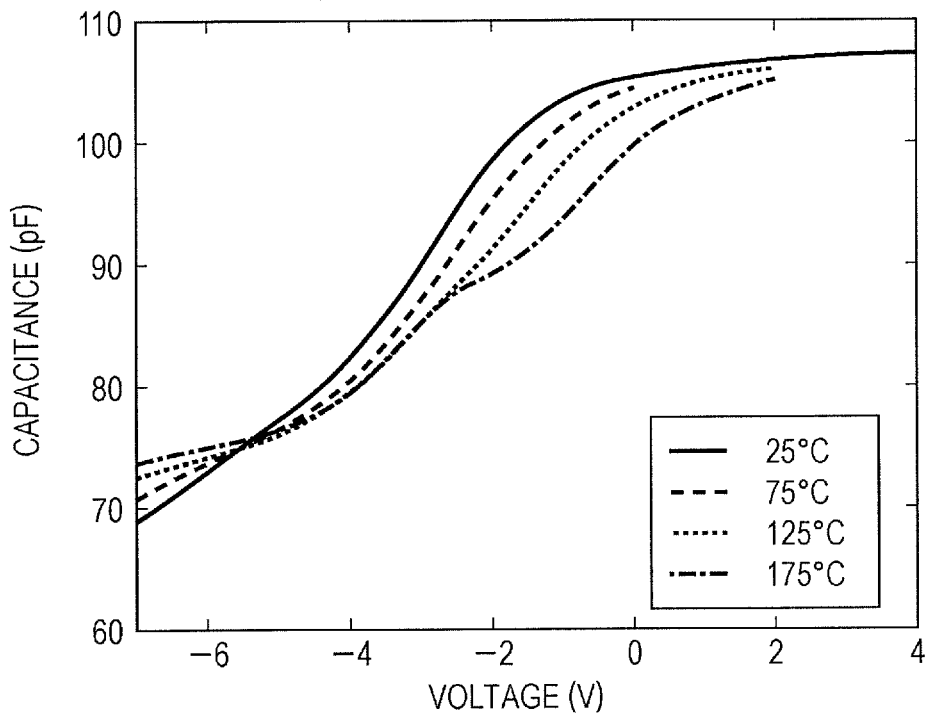
FIGS. 1A and 1B illustrate the characteristics of an existing GaN-MOS diode.
Figure 1B:
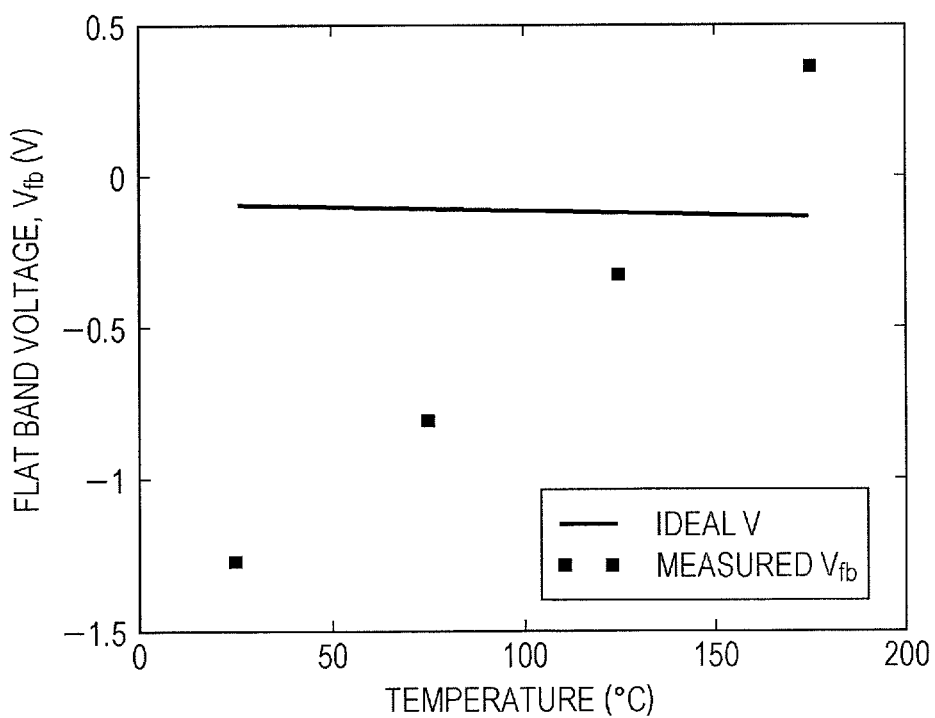
Figure 2A:
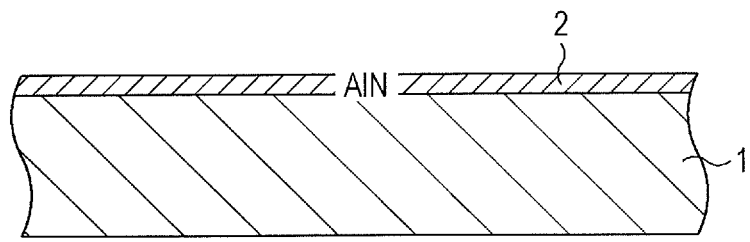
FIGS. 2A to 2C are schematic cross-sectional views illustrating processes for manufacturing a GaN-HEMT according to a first embodiment in sequence.

As illustrated in FIG. 2A, a buffer layer 2 is formed on an Si substrate 1. The Si substrate 1 is, for example, prepared as a growth substrate. In place of the Si substrate 1, a SiC substrate, a sapphire substrate, a GaAs substrate, a GaN substrate, or another substrate may be used. The substrate may be a semi-insulating substrate or a conductive substrate. AlN is grown on the Si substrate 1 to a thickness of approximately 10 nm to 100 nm by, for instance, metal organic vapor phase epitaxy (MOVPE). In the growth of AlN, a mixed gas of trimethylaluminum (TMAl) gas and ammonia ($NH_3$) gas is used as the source gas. The flow rate of the $NH_3$ gas is approximately in the range of 100 ccm to 10 LM. The growth pressure is approximately in the range of 50 Torr to 300 Torr, and the growth temperature is approximately in the range of 1000° C. to 1200° C. The buffer layer 2 is formed under these conditions. In place of MOVPE, molecular beam epitaxy (MBE) or another technique may be used. In the formation of the buffer layer 2, AlGaN may replace AlN, or GaN may be grown at low temperature.

Figure 2B:
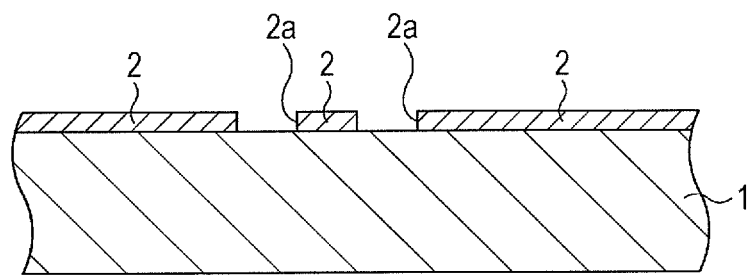

Then, as illustrated in FIG. 2B, grooves 2a are formed in the buffer layer 2. In particular, multiple (two in the illustration of the first embodiment) grooves 2a are formed in parts of the buffer layer 2 at predetermined intervals in a stripe pattern so as to have a longitudinal direction substantially parallel to the longitudinal direction (gate width direction) of a gate electrode which will be described later, the parts of the buffer layer 2 corresponding to positions at which N-face GaN layers are to be grown. The width of each groove 2a is approximately not more than 0.1 μm. The term "N-face" refers to a surface (upper surface) that is an N plane having a plane orientation of c-(000-1). In this case, the expressions "c-" and "−1" are used as synonyms of "c" and "1" above which the symbol "-" is put, respectively. In order to form the grooves 2a, a resist is applied onto the buffer layer 2, and then the resist is processed by lithography to form a resist mask. The buffer layer 2 is dry-etched with the resist mask. In this manner, the grooves 2a are formed in the buffer layer 2 such that the surface of the Si substrate 1 is exposed at the bottoms of the grooves 2a.

Figure 2C:
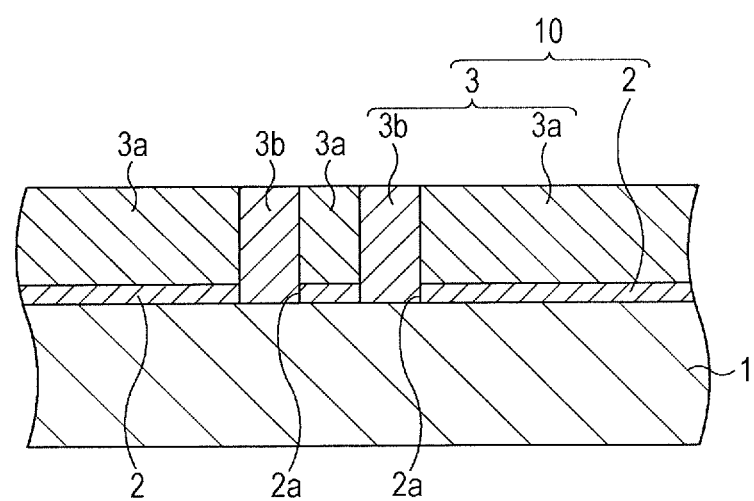

Then, as illustrated in FIGS. 2C and 5A, an electron transit layer 3 is formed so as to cover the buffer layer 2. FIG. 2C corresponds to the cross section taken along the dashed line IIC-IIC in FIG. 5A. In particular, GaN is grown by MOVPE to a thickness of approximately 1 μm so as to cover the buffer layer 2. In the growth of GaN, a mixed gas of trimethylgallium (TMGa) gas and $NH_3$ gas is used as the source gas. The flow rate of the $NH_3$ gas is approximately in the range of 100 ccm to 10 LM. The growth pressure is approximately in the range of 50 Torr to 300 Torr, and the growth temperature is approximately in the range of 1000° C. to 1200° C. The electron transit layer 3 is formed under these conditions. In place of MOVPE, MBE or another technique may be used.

GaN grown on the AlN of the buffer layer 2 has a Ga-face, and GaN grown on, for instance, Si has an N-face. In the first embodiment, Ga-face GaN is grown on the buffer layer 2, and N-face GaN is grown on the Si substrate 1 exposed at the bottoms of the grooves 2a formed in the buffer layer 2. The Ga-face GaN is grown on the buffer layer 2 to a thickness of approximately 1 µm. In regions between the adjoining grooves 2a, the Ga-face GaN is grown so as to be arranged in a stripe pattern substantially parallel to the gate width direction, and each stripe has a width of not more than 0.1 µm. The N-face GaN is grown so as to fill the grooves 2a and so as to be arranged in a stripe pattern substantially parallel to the gate width direction, and each pattern has a thickness of approximately 1 µm from the upper edges of the grooves 2a and has a width of not more than 0.1 µm. Ga-face GaN layers 3a and N-face GaN layers 3b are grown as described above, and the electron transit layer 3 is formed in a self-organizing manner. The buffer layer 2 and the electron transit layer 3 constitute a layered compound semiconductor structure 10.

Figure 3A:
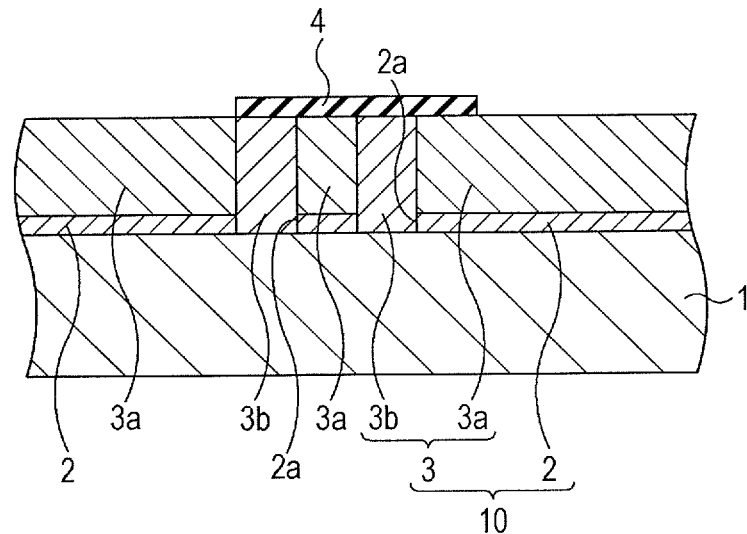
FIGS. 3A to 3C are schematic cross-sectional views illustrating the subsequent processes for manufacturing the GaN-HEMT according to the first embodiment in sequence.

Then, as illustrated in FIG. 3A, a gate insulating film 4 is formed. In particular, an insulating material, such as $SiO_2$, is deposited on the electron transit layer 3. $SiO_2$ is deposited by, for example, a chemical vapor deposition (CVD) method to a thickness of approximately 40 nm. The deposited $SiO_2$ is processed by lithography and dry etching so as to be left at a position at which a gate electrode is to be formed. The gate insulating film 4 is formed in this manner. In place of $SiO_2$, for instance, SiN, $Al_2O_3$, or nitrides or oxynitrides of Al may be deposited.

In this case, $Al_2O_3$ may be deposited by, for instance, an atomic layer deposition (ALD) method, a plasma CVD method, or a sputtering method. In place of $Al_2O_3$, nitrides or oxynitrides of Al may be used. Furthermore, in order to form the gate insulating film 4, oxides, nitrides, or oxynitrides of Si, Hf, Zr, Ti, Ta, or W may be used, or an appropriate combination thereof may be employed to form a multilayered structure.

Figure 3B:
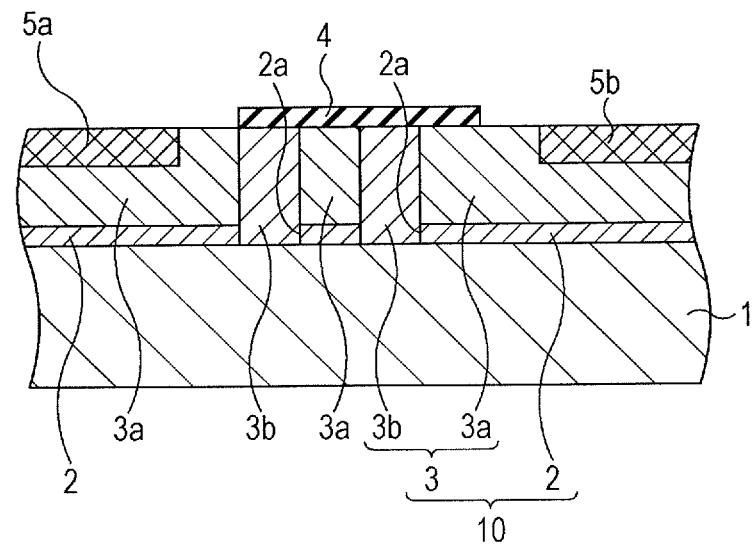

Then, as illustrated in FIG. 3B, impurity diffusion layers 5a and 5b are formed in the electron transit layer 3. In particular, ions of an n-type impurity, such as silicon (Si) in this case, are implanted into parts of the electron transit layer 3 which are positioned on the both sides of the gate insulating film 4 and on which a source electrode and a drain electrode are to be separately formed, the concentration of Si being not less than $1 \times 10^{20}/cm^3$. In this manner, the impurity diffusion layers 5a and 5b are formed in the electron transit layer 3.

Then, device isolation structure is formed. In particular, for example, argon (Ar) is implanted into a device isolation region of the layered compound semiconductor structure 10. In this manner, a device isolation structure is formed on the surfaces of the layered compound semiconductor structure 10 and the Si substrate 1. The device isolation structure defines active regions on the layered compound semiconductor structure 10. The device isolation structure may be formed by, for instance, a shallow trench isolation (STI) method instead of the above-mentioned ion implantation. In this case, for example, a chlorine-based etching gas is used for dry etching of the layered compound semiconductor structure 10.

Figure 3C:
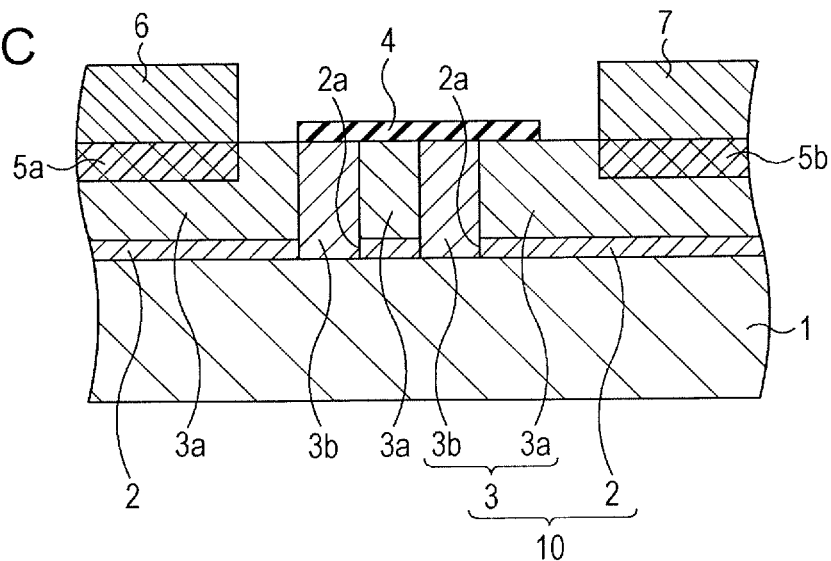

Then, as illustrated in FIG. 3C, a source electrode 6 and a drain electrode 7 are formed. In particular, a resist is applied onto the surfaces of the electron transit layer 3 and gate insulating film 4, and the resist is processed by lithography to form openings in which the impurity diffusion layers 5a and 5b are exposed. In this manner, a resist mask having such openings is formed. An electrode material such as Ti/Al is deposited by, for example, a vapor deposition technique on the resist mask and in the openings in which the impurity diffusion layers 5a and 5b are exposed. Ti is deposited to a thickness of approximately 20 nm, and Al is deposited to a thickness of approximately 200 nm. The resist mask and Ti/Al deposited thereon are removed by a lift-off technique. Then, the Si substrate 1 is annealed, for example, under a nitrogen atmosphere at approximately 400° C. to 1000° C., such as approximately 600° C., and the remaining Ti/Al is brought into ohmic contact with the impurity diffusion layers 5a and 5b. The annealing does not have to be carried out in some cases provided that Ti/Al is brought into ohmic contact with the impurity diffusion layers 5a and 5b. In this manner, the source electrode 6 and the drain electrodes 7 are formed on the impurity diffusion layers 5a and 5b, respectively.

Figure 4A:
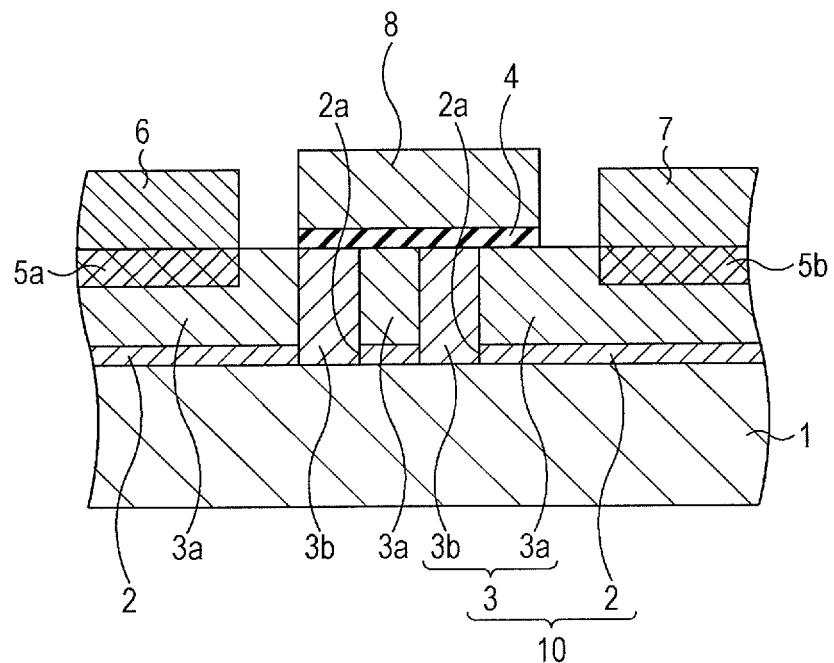
FIGS. 4A and 4B are schematic cross-sectional views illustrating the subsequent processes for manufacturing the GaN-HEMT according to the first embodiment in sequence.
Figure 5A:
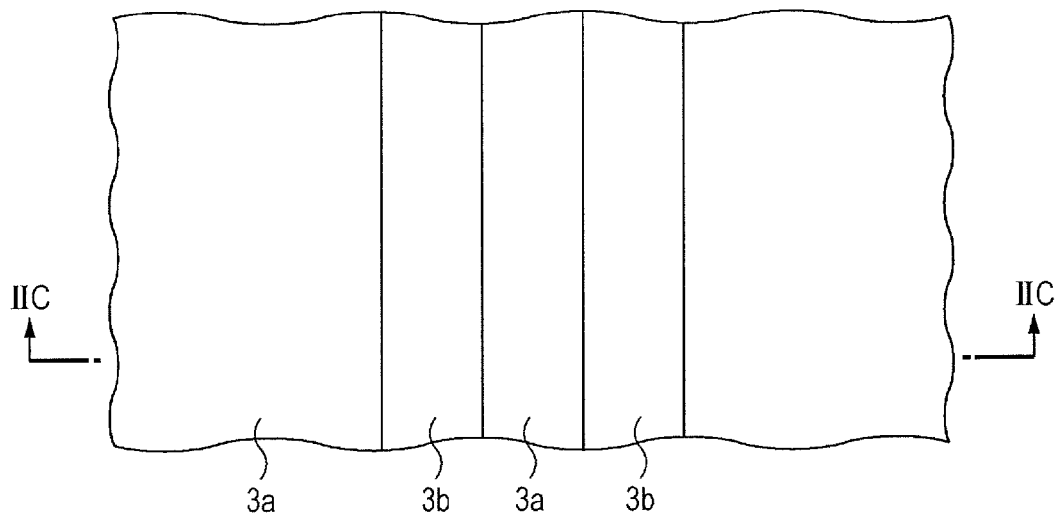
FIGS. 5A and 5B are schematic plan views illustrating the processes for manufacturing the GaN-HEMT according to the first embodiment.
Figure 5B:
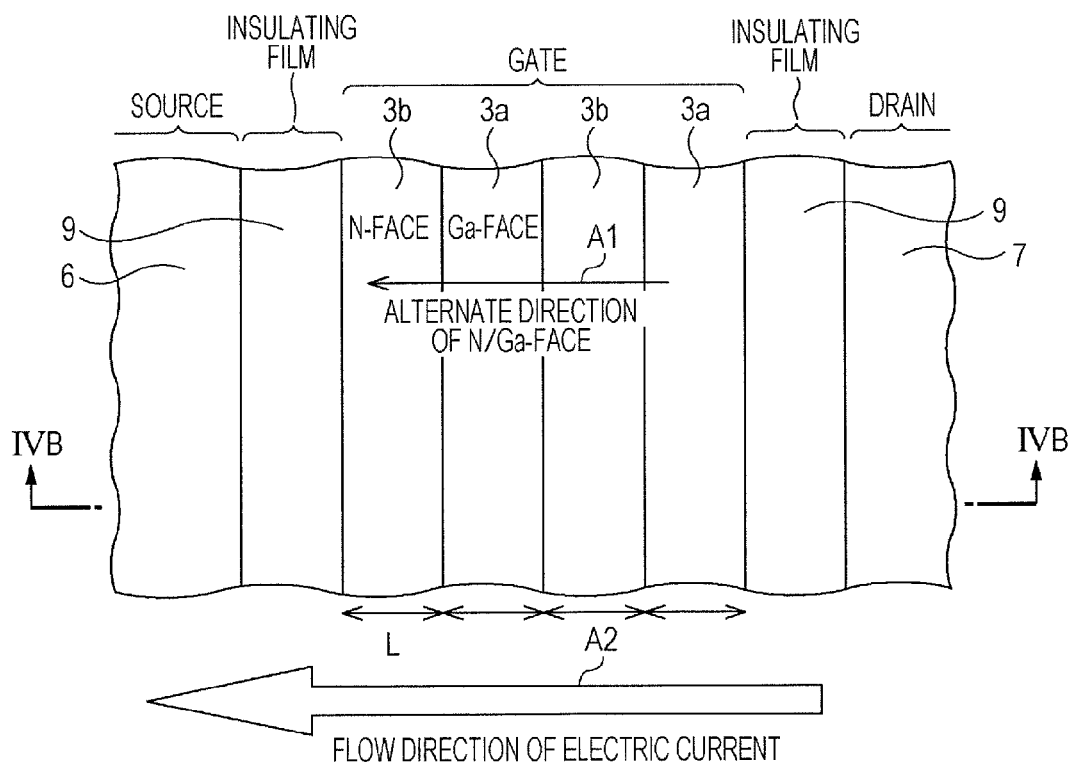

Then, as illustrated in FIG. 4A, a gate electrode 8 is formed. In particular, a resist is applied onto the surface of the electron transit layer 3 so as to cover the gate insulating film 4, the source electrode 6, and the drain electrode 7, and then the resist is processed by lithography to form an opening in which the gate insulating film 4 is exposed. In this manner, a resist mask having such an opening is formed. An electrode material such as Ni/Au is deposited on the resist mask and in the gate insulating film 4-exposed opening by, for example, a vapor deposition technique. Ni is deposited to a thickness of approximately 30 nm, and Au is deposited to a thickness of approximately 400 nm. The resist mask and Ni/Au deposited thereon are removed by a lift-off technique. Through this process, the gate electrode 8 is formed on the gate insulating film 4.

Figure 4B:
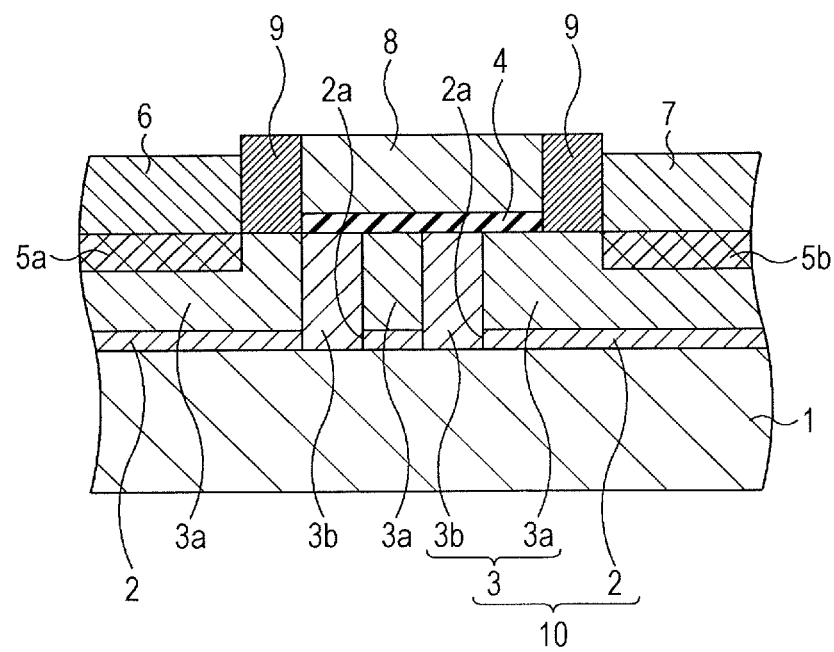

Then, as illustrated in FIGS. 4B and 5B, a protective film 9 is formed. In FIG. 5B, illustration of the gate insulating film 4 and gate electrode 8 is omitted. FIG. 4B corresponds to the cross section taken along the dashed line IVB-IVB in FIG. 5B. In particular, an insulating material, such as $SiO_2$, is deposited by, for instance, a CVD method to fill entire spaces between the source electrode 6 and the gate electrode 8 and between the drain electrode 7 and the gate electrode 8. The deposited $SiO_2$ is processed by lithography and dry etching so as to be left between the source electrode 6 and the gate electrode 8 and between the drain electrode 7 and the gate electrode 8. In this manner, the protective film 9 is formed such that the spaces between the source electrode 6 and the gate electrode 8 and between the drain electrode 7 and the gate electrode 8 are filled.

In the first embodiment, as illustrated in FIG. 5B, a direction (alternate direction) A1 in which the Ga-face GaN layers 3a and the N-face GaN layers 3b are alternately arranged in parallel is substantially parallel to a direction A2 in which electric current flows in part of the electron transit layer 3 between the source electrode 6 and the drain electrode 7.

Then, manufacturing of the GaN-HEMT of the first embodiment is completed through processes, for example, for providing wiring connected to the source electrode 6, the drain electrode 7, and the gate electrode 8.

Figure 6:
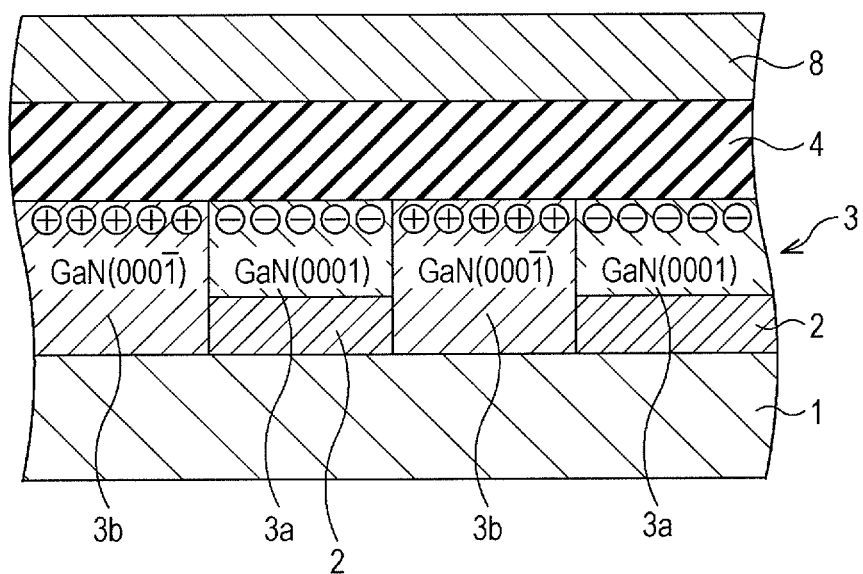
FIG. 6 is an enlarged cross-sectional view schematically illustrating a region below a gate electrode in the GaN-HEMT according to the first embodiment.

FIG. 6 is an enlarged cross-sectional view schematically illustrating the region below the gate electrode 8 in the GaN-HEMT of the first embodiment, and the illustration in FIG. 6 corresponds to the cross section taken along the dashed line VI-VI in FIG. 5B. As illustrated in FIG. 6, in the GaN-HEMT of the first embodiment, the multiple Ga-face GaN layers 3a and the multiple N-face GaN layer 3b are alternately arranged below the gate electrode 8 (right under the gate insulating film 4). Owing to spontaneous polarization of GaN, negative spontaneous polarization charges are present in the Ga-face GaN layers 3a in the vicinity of the surfaces thereof, and positive spontaneous polarization charges having opposite polarity to negative spontaneous polarization charges are present in the N-face GaN layers 3b in the vicinity of the surfaces thereof. This structure enables the charges generated by spontaneous polarization of GaN to be substantially balanced and neutralized right under the gate insulating film 4 as a whole. In this case, even when temperature is changed, a variation in spontaneous polarization charges in the Ga-face GaN layers 3a are substantially the same as a variation in spontaneous polarization charges in the N-face GaN layers 3b. Hence, neutralization of spontaneous polarization charges dissolves the temperature dependence of a threshold voltage and flat band voltage in the GaN-HEMT.

In the GaN-HEMT of the first embodiment, the spontaneous polarization charges under the gate insulating film 4 are neutralized in a state in which a gate voltage is not applied; hence, application of a drain voltage does not lead to the flow of electric current, and thus the transistor is in an off-mode, which enables operation in a normally-off mode. In contrast, in the case where a positive voltage is applied to the gate electrode 8, two-dimensional electron gas (2DEG) is accumulated in the electron transit layer 3 in the vicinity of the interface to the gate insulating film 4, and application of a drain voltage therefore leads to the flow of electric current, so that the transistor enters an on-mode.

Result of detailed analysis of the neutralization of spontaneous polarization charges below the gate electrode 8 of the first embodiment will now be described. Neutralization of spontaneous polarization charges is analyzed by simulation [technology computer-aided design (TACD) calculation] in which the width L of the Ga-face GaN layers 3a and N-face GaN layers 3b below the gate electrode 8 in FIG. 5B is changed. In the simulation, a structure of electrode metal/$Al_2O_3$/n-GaN is employed. The thickness of $Al_2O_3$ is 40 nm, and the concentration of n-GaN as an n-type dopant is $1 \times 10^{15}/cm^3$. Spontaneous polarization charges are defined as positive and negative fixed charges which are present at the interface of $Al_2O_3$/GaN at a concentration of $1 \times 10^{12}/cm^3$. The metal electrode is a Ti electrode (work function: 4.25 eV).

FIGS. 7A to 7D illustrate results of the simulation. FIG. 7A illustrates a case in which spontaneous polarization charges are not generated (existing techniques), and FIGS. 7B to 7D illustrate cases in which the widths L are 1 μm, 0.2 μm, and 0.1 μm, respectively. In FIG. 7B, electron density is uneven, and electron density is still uneven to some extent also in FIG. 7C. In FIG. 7D, electron density is substantially even. As is clear from evaluation of these results, a width L of not more than 0.1 μm enables sufficiently even electron density.

Figure 8:
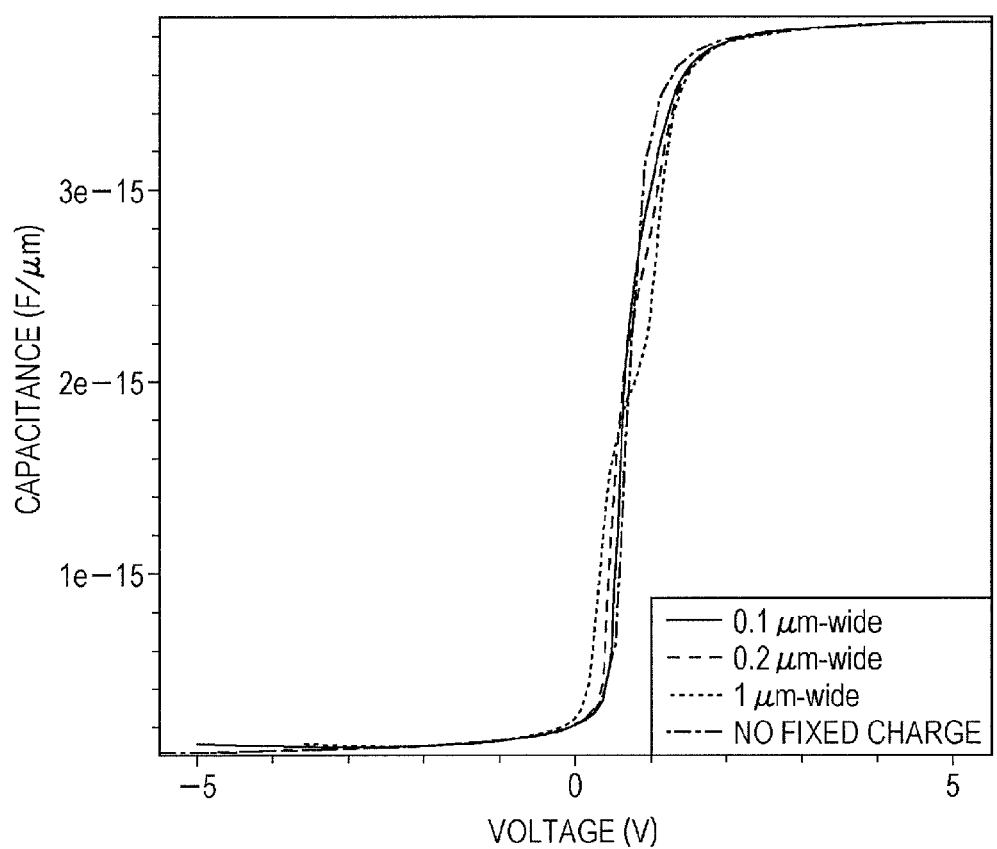
FIG. 8 illustrates C-V characteristics obtained in the simulations in FIGS. 7A to 7D.

FIG. 8 illustrates the C-V characteristics obtained in the simulation. With reference to FIG. 8, in the case where the width L of the Ga-face GaN layers 3a and N-face GaN layers 3b is 1 μm, the C-V curve rises in two stages. Accordingly, this C-V curve indicates that a depletion state occurs two times and that charges are not neutralized. In contrast, a decrease in the width L causes C-V characteristics to approach the characteristics obtained when spontaneous polarization charges are not generated. Hence, as is clear from the results of calculation, a width L of not more than 0.1 μm enables neutralization of spontaneous polarization charges. The first embodiment gives an example of an electron transit layer in which the width L is not more than 0.1 μm.

Figure 9:
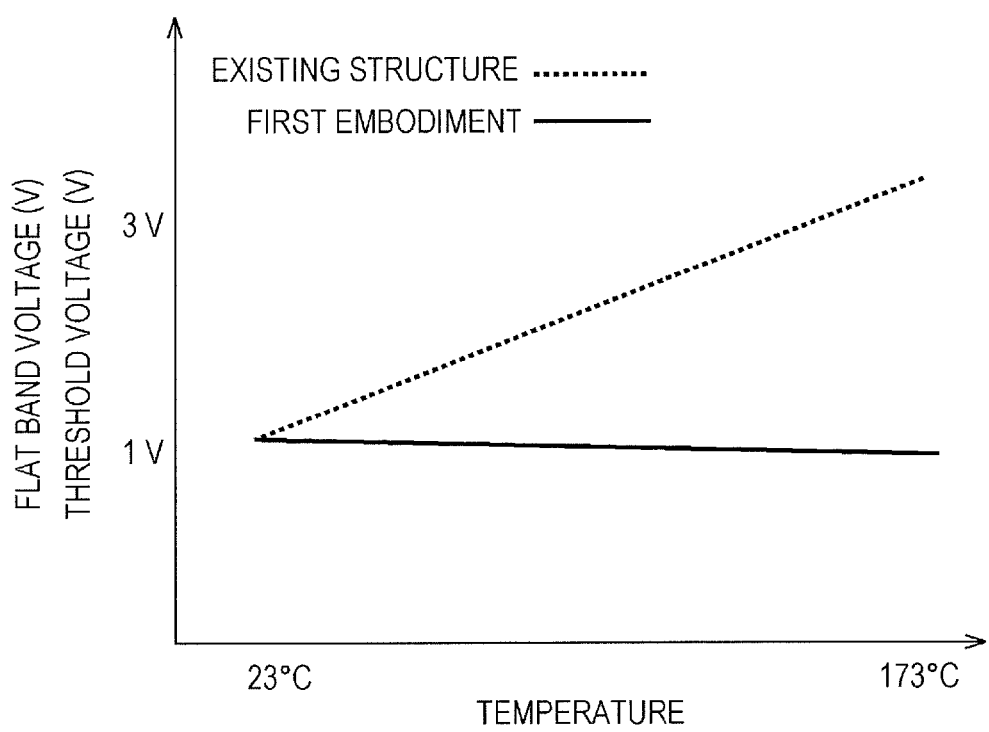
FIG. 9 illustrates result of comparison in temperature dependence of a threshold voltage and flat band voltage between the GaN-HEMT according to the first embodiment and an existing structure.

The temperature dependence of a threshold voltage and flat band voltage in the GaN-HEMT of the first embodiment are compared with that in a GaN-HEMT having the existing structure, and FIG. 9 illustrates the result thereof. In the existing structure, an electron transit layer includes Ga-face GaN alone. As illustrated in FIG. 9, the temperature dependence of a threshold voltage and flat band voltage is 80% to 90% smaller in the GaN-HEMT in which spontaneous polarization charges are neutralized owing to the electron transit layer having the structure of the first embodiment than in a GaN-HEMT having the existing structure.

As described above, the GaN-HEMT of the first embodiment enables great reductions in temperature dependence of a threshold voltage and flat band voltage with the result that a threshold voltage and a flat band voltage are well stabilized and has high reliability and high breakdown voltage in a normally-off mode.

Second Embodiment

Although a second embodiment discloses the structure of a GaN-HEMT and a method for manufacturing the GaN-HEMT as in the first embodiment, the second embodiment is different from the first embodiment in the structure of the electron transit layer. The same components as used in the first embodiment are denoted by the same reference symbols, and detailed description thereof is omitted. FIGS. 10A to 12B are schematic cross-sectional views illustrating processes for manufacturing the GaN-HEMT according to the second embodiment in sequence. FIGS. 13A and 13B are schematic plan views corresponding to FIGS. 10C and 12B, respectively.

Figure 10A:
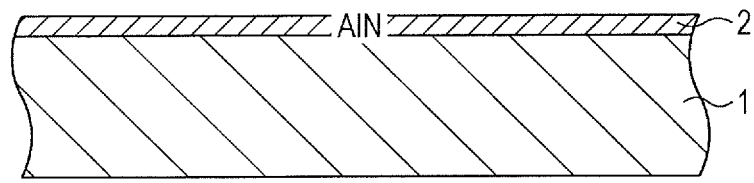
FIGS. 10A to 10C are schematic cross-sectional views illustrating processes for manufacturing a GaN-HEMT according to a second embodiment in sequence.

As illustrated in FIG. 10A, a buffer layer 2 is formed on an Si substrate 1. AlN is grown on the Si substrate 1 to a thickness of approximately 10 nm to 100 nm by, for instance, MOVPE. In the growth of AlN, a mixed gas of TMAl gas and $NH_3$ gas is used as the source gas. The flow rate of the $NH_3$ gas is approximately in the range of 100 ccm to 10 LM. The growth pressure is approximately in the range of 50 Torr to 300 Torr, and the growth temperature is approximately in the range of 1000° C. to 1200° C. The buffer layer 2 is formed under these conditions. In place of MOVPE, MBE or another technique may be used. In the formation of the buffer layer 2, AlGaN may replace AlN, or GaN may be grown at low temperature.

Figure 10B:
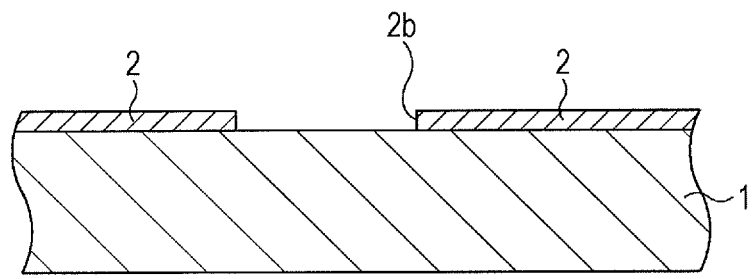

Then, as illustrated in FIG. 10B, grooves 2b are formed in the buffer layer 2. In particular, multiple (two in the illustration of the second embodiment) grooves 2b are formed in parts of the buffer layer 2 at predetermined intervals in a stripe pattern so as to have a longitudinal direction substantially orthogonal to the longitudinal direction (gate width direction) of a gate electrode which will be described later, the parts of the buffer layer 2 corresponding to positions at which N-face GaN layers are to be grown. The width of each groove 2b is approximately not more than 0.1 μm. In order to form the grooves 2b, a resist is applied onto the buffer layer 2, and then the resist is processed by lithography to form a resist mask. The buffer layer 2 is dry-etched with the resist mask. In this manner, the grooves 2b are formed in the buffer layer 2 such that the surface of the Si substrate 1 is exposed at the bottoms of the grooves 2b.

Figure 10C:
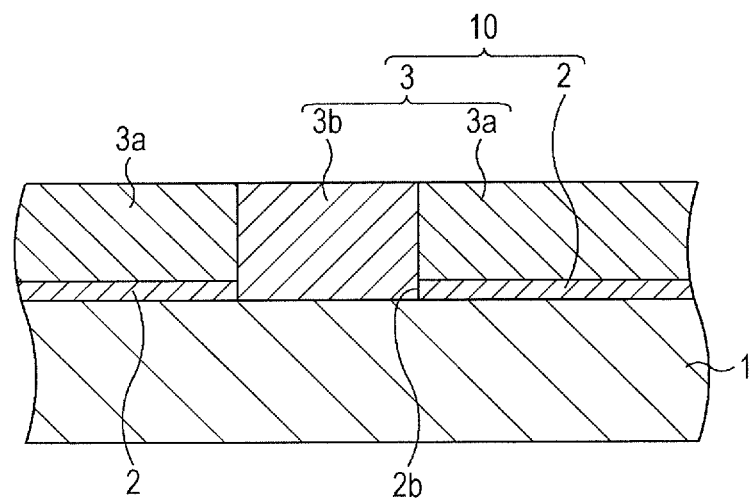

Then, as illustrated in FIGS. 10C and 13A, an electron transit layer 3 is formed so as to cover the buffer layer 2. FIG. 10C corresponds to the cross section taken along the dashed line XC-XC in FIG. 13A. In particular, GaN is grown by MOVPE to a thickness of approximately 1 μm so as to cover the buffer layer 2. In the growth of GaN, a mixed gas of TMGa gas and $NH_3$ gas is used as the source gas. The flow rate of the $NH_3$ gas is approximately in the range of 100 ccm to 10 LM. The growth pressure is approximately in the range of 50 Torr to 300 Torr, and the growth temperature is approximately in the range of 1000° C. to 1200° C. The electron transit layer 3 is formed under these conditions. In place of MOVPE, MBE or another technique may be used.

GaN grown on the AlN of the buffer layer 2 has a Ga-face, and GaN grown on, for instance, Si has an N-face. In the second embodiment, Ga-face GaN is grown on the buffer layer 2, and N-face GaN is grown on the Si substrate 1 exposed at the bottoms of the grooves 2b formed in the buffer layer 2. The Ga-face GaN is grown on the buffer layer 2 to a thickness of approximately 1 μm. In regions between the adjoining grooves 2b, the Ga-face GaN is grown so as to be arranged in a stripe pattern substantially orthogonal to the gate width direction, and each stripe has a width of not more than 0.1 μm. The N-face GaN is grown so as to fill the grooves 2b and so as to be arranged in a stripe pattern substantially orthogonal to the gate width direction, and each pattern has a thickness of approximately 1 μm from the upper edges of the grooves 2b and has a width of not more than 0.1 μm. Ga-face GaN layers 3a and N-face GaN layers 3b are grown as described above, and the electron transit layer 3 is formed in a self-organizing manner. The buffer layer 2 and the electron transit layer 3 constitute a layered compound semiconductor structure 10.

Figure 11A:
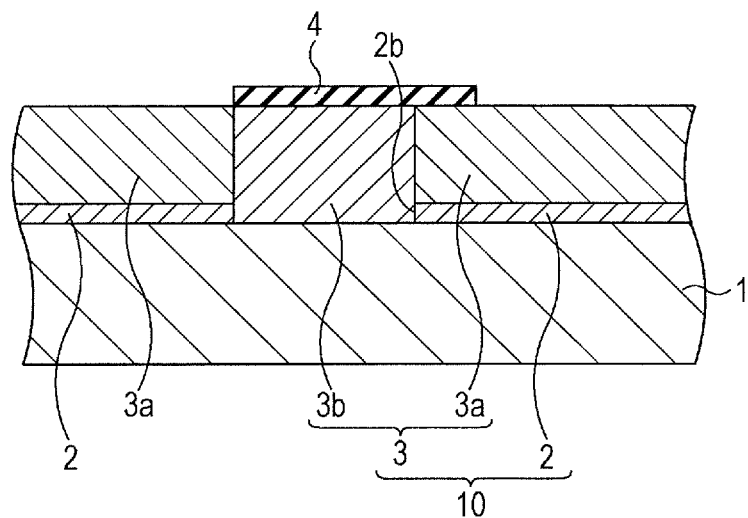
FIGS. 11A to 11C are schematic cross-sectional views illustrating the subsequent processes for manufacturing the GaN-HEMT according to the second embodiment in sequence.

Then, as illustrated in FIG. 11A, a gate insulating film 4 is formed. In particular, an insulating material, such as $SiO_2$, is deposited on the electron transit layer 3. $SiO_2$ is deposited by, for example, a CVD method to a thickness of approximately 40 nm. The deposited $SiO_2$ is processed by lithography and dry etching so as to be left at a position at which a gate electrode is to be formed. The gate insulating film 4 is formed in this manner. In place of $SiO_2$, for instance, SiN, $Al_2O_3$, or nitrides or oxynitrides of Al may be deposited.

In this case, $Al_2O_3$ may be deposited by, for instance, an ALD method, a plasma CVD method, or a sputtering method. In place of $Al_2O_3$, nitrides or oxynitrides of Al may be used. Furthermore, in order to form the gate insulating film 4, oxides, nitrides, or oxynitrides of Si, Hf, Zr, Ti, Ta, or W may be used, or an appropriate combination thereof may be employed to form a multilayered structure.

Figure 11B:
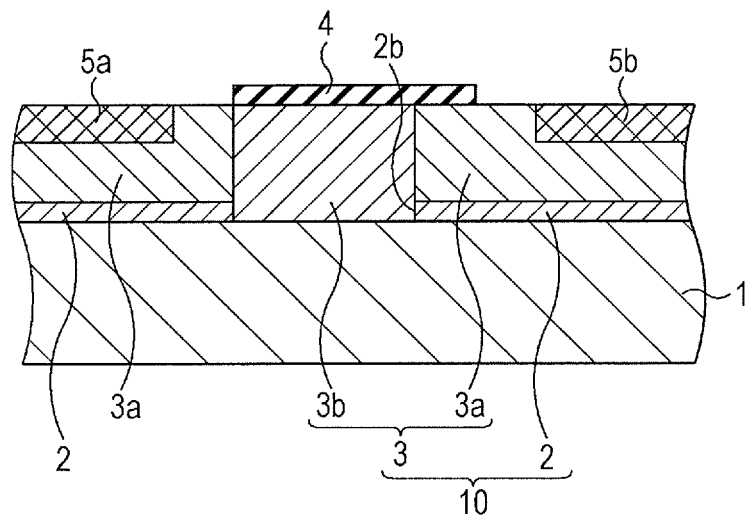

Then, as illustrated in FIG. 11B, impurity diffusion layers 5a and 5b are formed in the electron transit layer 3. In particular, ions of an n-type impurity, such as silicon (Si) in this case, are implanted into parts of the electron transit layer 3 which are positioned on the both sides of the gate insulating film 4 and on which a source electrode and a drain electrode are to be separately formed, the concentration of Si being not less than $1 \times 10^{20}/cm^3$. In this manner, the impurity diffusion layers 5a and 5b are formed in the electron transit layer 3.

Then, device isolation structure is formed. In particular, for example, argon (Ar) is injected into a device isolation region of the layered compound semiconductor structure 10. In this manner, a device isolation structure is formed on the surfaces of the layered compound semiconductor structure 10 and the Si substrate 1. The device isolation structure defines active regions on the layered compound semiconductor structure 10. The device isolation structure may be formed by, for instance, an STI method instead of the above-mentioned ion implantation. In this case, for example, a chlorine-based etching gas is used for dry etching of the layered compound semiconductor structure 10.

Figure 11C:
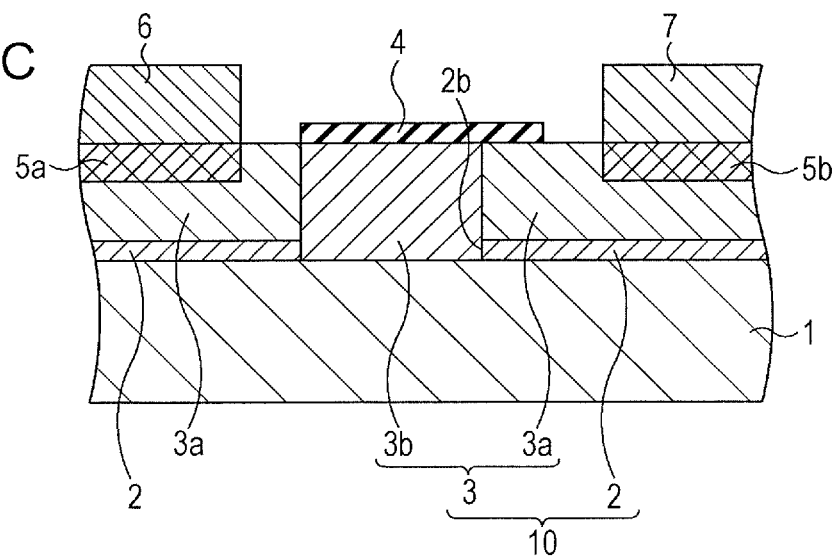

Then, as illustrated in FIG. 11C, a source electrode 6 and a drain electrode 7 are formed. In particular, a resist is applied onto the surfaces of the electron transit layer 3 and gate insulating film 4, and the resist is processed by lithography to form openings in which the impurity diffusion layers 5a and 5b are exposed. In this manner, a resist mask having such openings is formed. An electrode material such as Ti/Al is deposited by, for example, a vapor deposition technique on the resist mask and in the openings in which the impurity diffusion layers 5a and 5b are exposed. Ti is deposited to a thickness of approximately 20 nm, and Al is deposited to a thickness of approximately 200 nm. The resist mask and Ti/Al deposited thereon are removed by a lift-off technique. Then, the Si substrate 1 is annealed, for example, under a nitrogen atmosphere at approximately 400° C. to 1000° C., such as approximately 600° C., and the remaining Ti/Al is brought into ohmic contact with the impurity diffusion layers 5a and 5b. The annealing does not have to be carried out in some cases provided that Ti/Al is brought into ohmic contact with the impurity diffusion layers 5a and 5b. In this manner, the source electrode 6 and the drain electrodes 7 are formed on the impurity diffusion layers 5a and 5b, respectively.

Figure 12A:
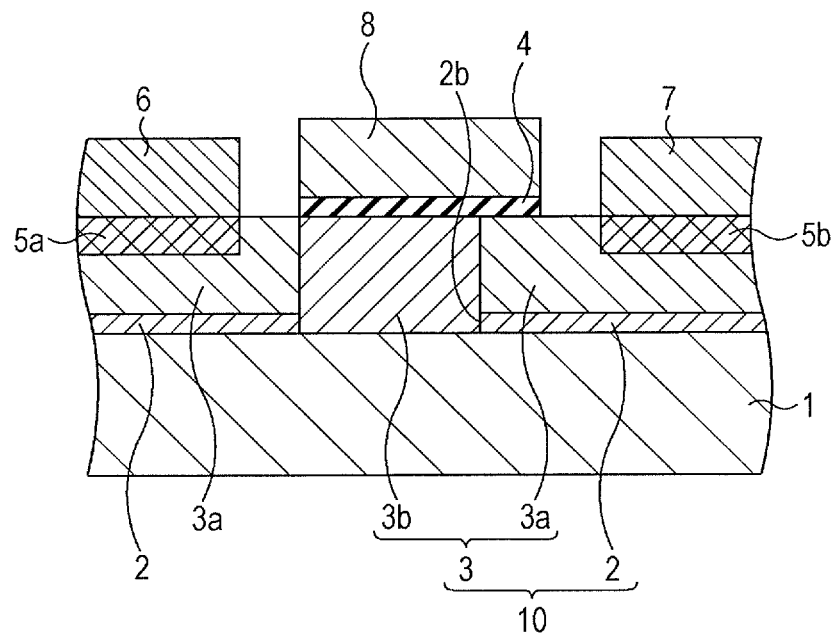
FIGS. 12A and 12B are schematic cross-sectional views illustrating the subsequent processes for manufacturing the GaN-HEMT according to the second embodiment in sequence.
Figure 13A:
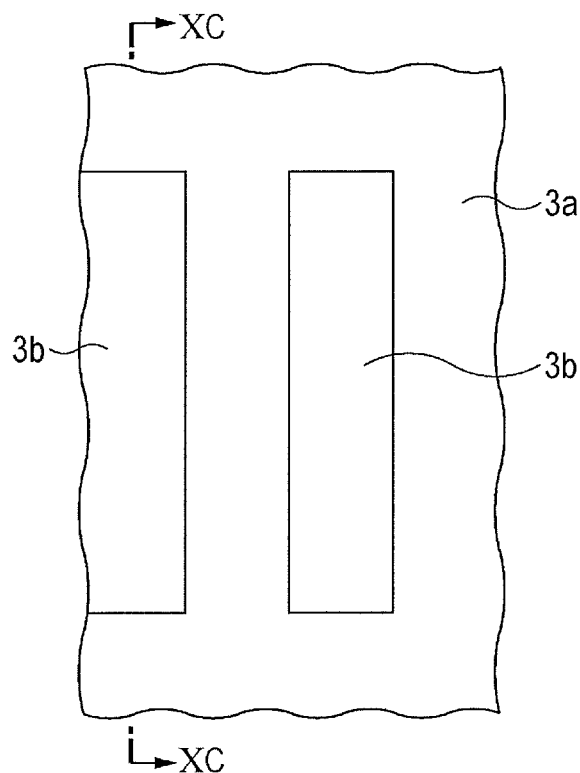
FIGS. 13A and 13B are schematic plan views illustrating the processes for manufacturing the GaN-HEMT according to the second embodiment.
Figure 13B:
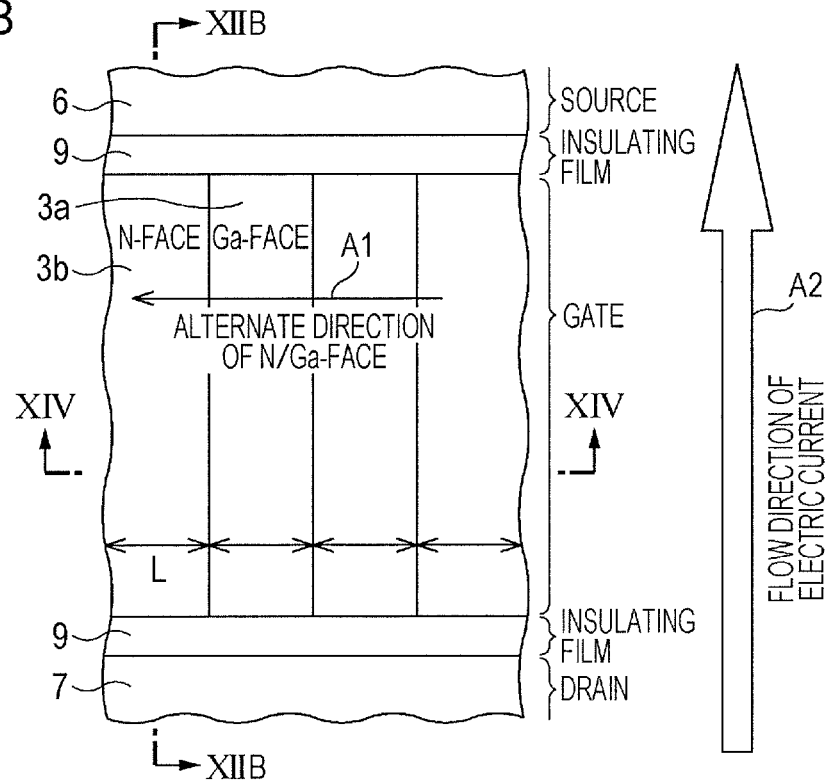

Then, as illustrated in FIG. 12A, a gate electrode 8 is formed. In particular, a resist is applied onto the surface of the electron transit layer 3 so as to cover the gate insulating film 4, the source electrode 6, and the drain electrode 7, and then the resist is processed by lithography to form an opening in which the gate insulating film 4 is exposed. In this manner, a resist mask having such an opening is formed. An electrode material such as Ni/Au is deposited on the resist mask and in the gate insulating film 4-exposed opening by, for example, a vapor deposition technique. Ni is deposited to a thickness of approximately 30 nm, and Au is deposited to a thickness of approximately 400 nm. The resist mask and Ni/Au deposited thereon are removed by a lift-off technique. Through this process, the gate electrode 8 is formed on the gate insulating film 4.

Figure 12B:
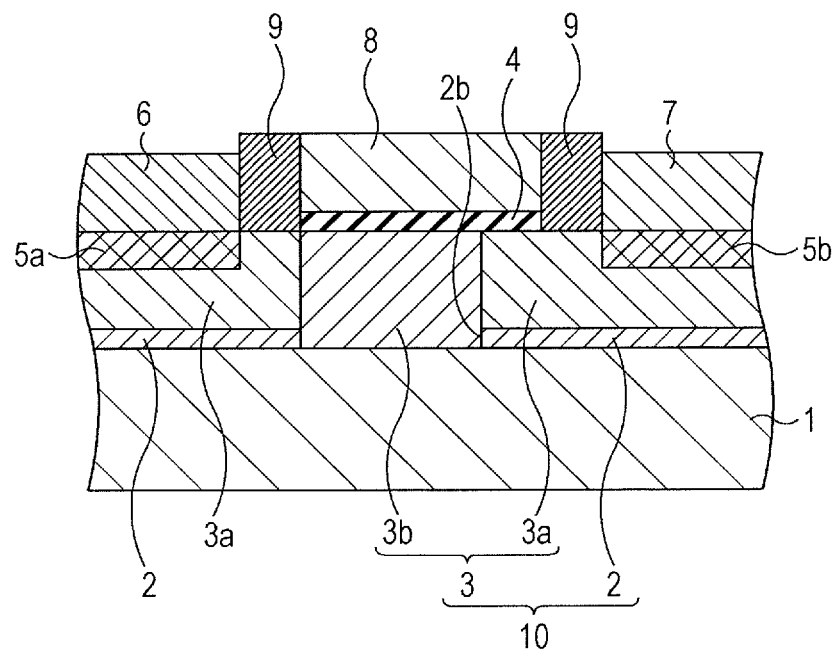

Then, as illustrated in FIGS. 12B and 13B, a protective film 9 is formed. In FIG. 13B, illustration of the gate insulating film 4 and gate electrode 8 is omitted. FIG. 12B corresponds to the cross section taken along the dashed line XIIIB-XIIIB in FIG. 13B. In particular, an insulating material, such as $SiO_2$, is deposited by, for instance, a CVD method to fill entire spaces between the source electrode 6 and the gate electrode 8 and between the drain electrode 7 and the gate electrode 8. The deposited $SiO_2$ is processed by lithography and dry etching so as to be left between the source electrode 6 and the gate electrode 8 and between the drain electrode 7 and the gate electrode 8. In this manner, the protective film 9 is formed such that the spaces between the source electrode 6 and the gate electrode 8 and between the drain electrode 7 and the gate electrode 8 are filled.

In the second embodiment, as illustrated in FIG. 13B, a direction (alternate direction) A1 in which the Ga-face GaN layers 3a and the N-face GaN layers 3b are alternately arranged in parallel is substantially orthogonal to a direction A2 in which electric current flows in part of the electron transit layer 3 between the source electrode 6 and the drain electrode 7. As in the first embodiment, the Ga-face GaN layers 3a and N-face GaN layers 3b of the second embodiment each have a width L of not more than 0.1 μm.

Then, manufacturing of the GaN-HEMT of the second embodiment is completed through processes, for example, for providing wiring connected to the source electrode 6, the drain electrode 7, and the gate electrode 8.

Figure 14:
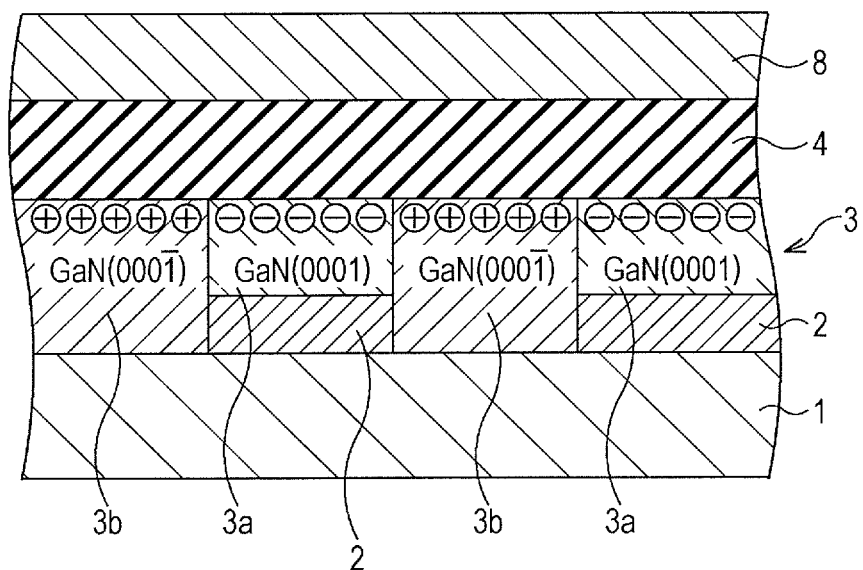
FIG. 14 is an enlarged cross-sectional view schematically illustrating a region below a gate electrode in the GaN-HEMT according to the second embodiment.

FIG. 14 is an enlarged cross-sectional view schematically illustrating the region below the gate electrode 8 in the GaN-HEMT of the second embodiment, and the illustration in FIG. 14 corresponds to the cross section taken along the dashed line XIV-XIV in FIG. 12B. As illustrated in FIG. 14, in the GaN-HEMT of the second embodiment, the multiple Ga-face GaN layers 3a and the multiple N-face GaN layer 3b are alternately arranged below the gate electrode 8 (right under the gate insulating film 4). Owing to spontaneous polarization of GaN, negative spontaneous polarization charges are present in the Ga-face GaN layers 3a in the vicinity of the surfaces thereof, and positive spontaneous polarization charges are present in the N-face GaN layers 3b in the vicinity of the surfaces thereof. This structure enables the charges generated by spontaneous polarization of GaN to be substantially balanced and neutralized right under the gate insulating film 4 as a whole. In this case, even when temperature is changed, a variation in spontaneous polarization charges in the Ga-face GaN layers 3a are substantially the same as a variation in spontaneous polarization charges in the N-face GaN layers 3b. Hence, neutralization of spontaneous polarization charges dissolves the temperature dependence of a threshold voltage and flat band voltage in the GaN-HEMT.

In the GaN-HEMT of the second embodiment, the spontaneous polarization charges under the gate insulating film 4 are neutralized in a state in which a gate voltage is not applied; hence, application of a drain voltage does not lead to the flow of electric current, and thus the transistor is in an off-mode, which enables operation in a normally-off mode. In contrast, in the case where a positive voltage is applied to the gate electrode 8, two-dimensional electron gas (2DEG) is accumulated in the electron transit layer 3 in the vicinity of the interface to the gate insulating film 4, and application of a drain voltage therefore leads to the flow of electric current, so that the transistor enters an on-mode.

Figure 15:
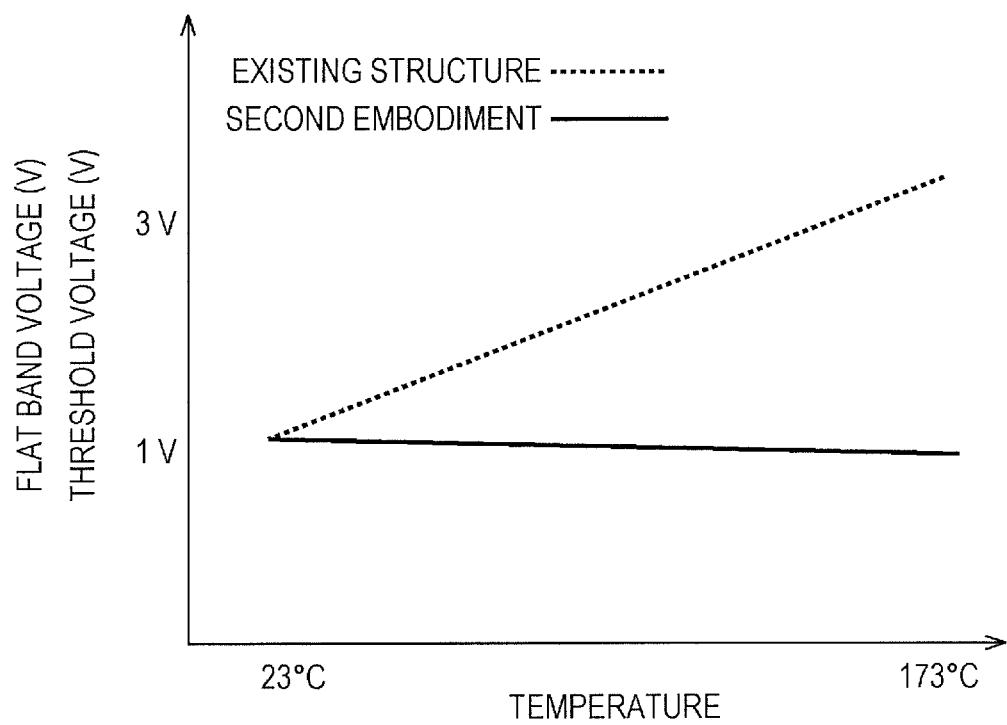
FIG. 15 illustrates result of comparison in temperature dependence of a threshold voltage and flat band voltage between the GaN-HEMT according to the second embodiment and an existing structure.

The temperature dependence of a threshold voltage and flat band voltage in the GaN-HEMT of the second embodiment are compared with that in a GaN-HEMT having the existing structure, and FIG. 15 illustrates the result thereof. In the existing structure, an electron transit layer includes Ga-face GaN alone. As illustrated in FIG. 15, the temperature dependence of a threshold voltage and flat band voltage is 80% to 90% smaller in the GaN-HEMT in which spontaneous polarization charges are neutralized owing to the electron transit layer having the structure of the second embodiment than in a GaN-HEMT having the existing structure.

In the second embodiment, as illustrated in FIG. 13B, the alternate direction Al of the Ga-face GaN layers 3a and N-face GaN layers 3b is substantially orthogonal to a direction A2 in which electric current flows in part of the electron transit layer 3 between the source electrode 6 and the drain electrode 7. In this case, even when electric potential is changed by the spontaneous polarization charges of the Ga-face GaN layers 3a and N-face GaN layers 3b, which have opposite polarity to each other, 2DEG which moves between the source electrode 6 and the drain electrode 7 is not scattered. Hence, on-resistance is decreased without mobility degradation.

As described above, the GaN-HEMT of the second embodiment enables great reductions in temperature dependence of a threshold voltage and flat band voltage with the result that a threshold voltage and a flat band voltage are well stabilized, enables a reduction in on-resistance, and has high reliability and high breakdown voltage in a normally-off mode.

Third Embodiment

Figure 19A:
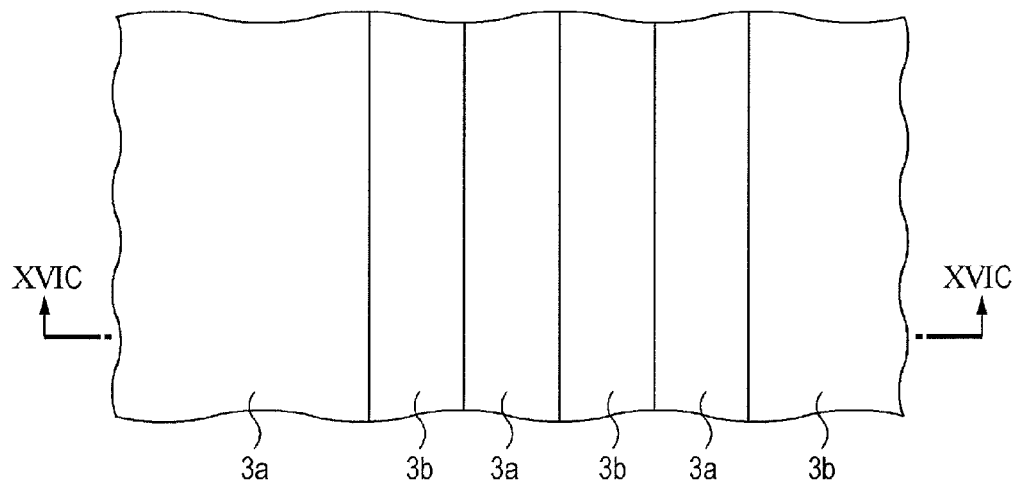
FIGS. 19A and 19B are schematic plan views illustrating the processes for manufacturing the GaN-HEMT according to the third embodiment.
Figure 19B:
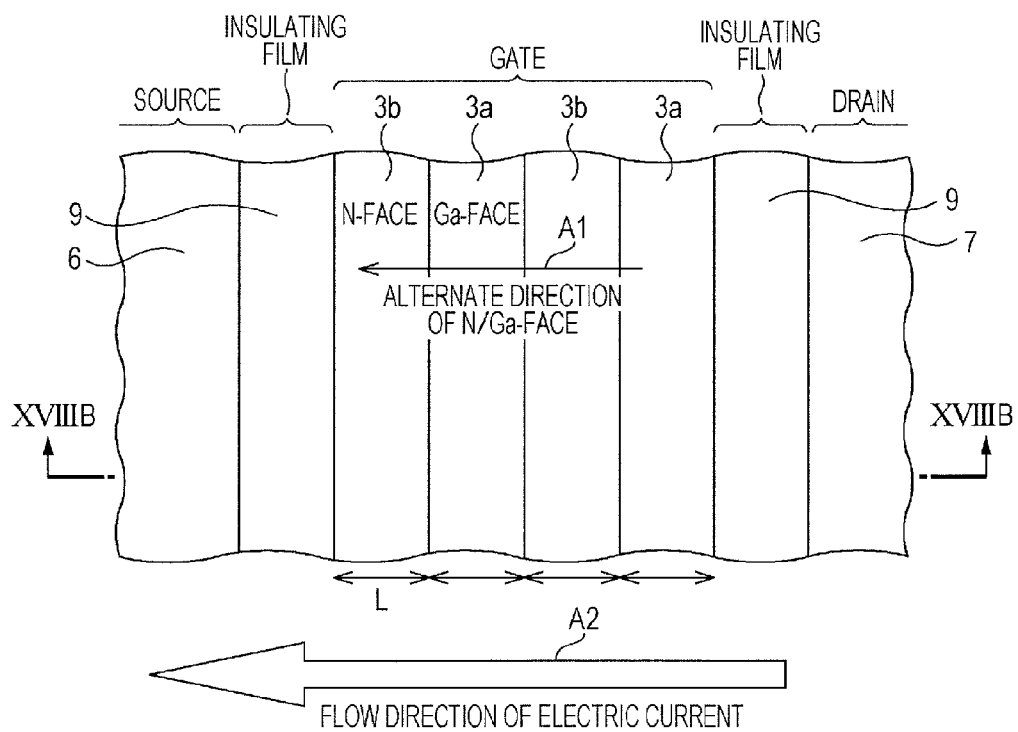

Although a third embodiment discloses the structure of a GaN-HEMT and a method for manufacturing the GaN-HEMT as in the first embodiment, the third embodiment is different from the first embodiment in the structure of the electron transit layer. The same components as used in the first embodiment are denoted by the same reference symbols, and detailed description thereof is omitted. FIGS. 16A to 18B are schematic cross-sectional views illustrating processes for manufacturing the GaN-HEMT according to the third embodiment in sequence. FIGS. 19A and 19B are schematic plan views corresponding to FIG. 16C and FIG. 18B, respectively.

Figure 16A:
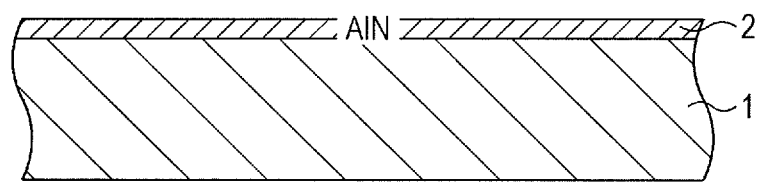
FIGS. 16A to 16C are schematic cross-sectional views illustrating processes for manufacturing a GaN-HEMT according to a third embodiment in sequence.

As illustrated in FIG. 16A, a buffer layer 2 is formed on an Si substrate 1. AlN is grown on the Si substrate 1 to a thickness of approximately 10 nm to 100 nm by, for instance, MOVPE. In the growth of AlN, a mixed gas of TMAl gas and $NH_3$ gas is used as the source gas. The flow rate of the $NH_3$ gas is approximately in the range of 100 ccm to 10 LM. The growth pressure is approximately in the range of 50 Torr to 300 Torr, and the growth temperature is approximately in the range of 1000° C. to 1200° C. The buffer layer 2 is formed under these conditions. In place of MOVPE, MBE or another technique may be used. In the formation of the buffer layer 2, AlGaN may replace AlN, or GaN may be grown at low temperature.

Figure 16B:
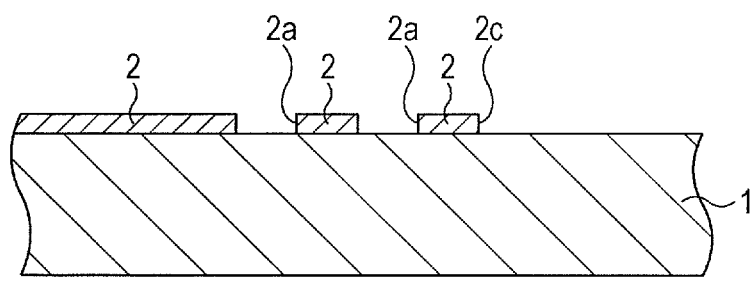

Then, as illustrated in FIG. 16B, grooves 2a and 2c are formed in the buffer layer 2. Multiple (two in the illustration of the third embodiment) grooves 2a are formed in parts of the buffer layer 2 at predetermined intervals in a stripe pattern so as to have a longitudinal direction substantially parallel to the longitudinal direction (gate width direction) of a gate electrode which will be described later, the parts of the buffer layer 2 corresponding to positions at which N-face GaN layers are to be grown. The width of each groove 2a is approximately not more than 0.1 μm. The groove 2C is formed in parallel with the grooves 2a such that part of the surface of the Si substrate 1 is exposed, this exposed part including a position at which a drain electrode is to be formed. In order to form the grooves 2a and 2c, a resist is applied onto the buffer layer 2, and then the resist is processed by lithography to form a resist mask. The buffer layer 2 is dry-etched with the resist mask. In this manner, the grooves 2a and 2c are formed in the buffer layer 2 such that the surface of the Si substrate 1 is exposed at the bottoms of the grooves 2a and 2c.

Figure 16C:
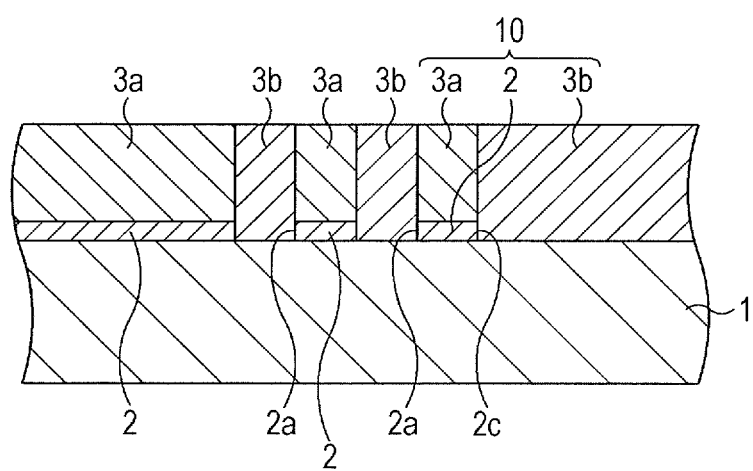

Then, as illustrated in FIGS. 16C and 19A, an electron transit layer 3 is formed so as to cover the buffer layer 2. FIG. 16C corresponds to the cross section taken along the dashed line XVIC-XVIC in FIG. 19A. In particular, GaN is grown by MOVPE to a thickness of approximately 1 μm so as to cover the buffer layer 2. In the growth of GaN, a mixed gas of TMGa gas and $NH_3$ gas is used as the source gas. The flow rate of the $NH_3$ gas is approximately in the range of 100 ccm to 10 LM. The growth pressure is approximately in the range of 50 Torr to 300 Torr, and the growth temperature is approximately in the range of 1000° C. to 1200° C. The electron transit layer 3 is formed under these conditions. In place of MOVPE, MBE or another technique may be used.

GaN grown on the AlN of the buffer layer 2 has a Ga-face, and GaN grown on, for instance, Si has an N-face. In the third embodiment, Ga-face GaN is grown on the buffer layer 2, and N-face GaN is grown on the Si substrate 1 exposed at the bottoms of the grooves 2a and 2c formed in the buffer layer 2. The Ga-face GaN is grown on the buffer layer 2 to a thickness of approximately 1 μm. In regions between the adjoining grooves 2a, the Ga-face GaN is grown so as to be arranged in a stripe pattern substantially parallel to the gate width direction, and each stripe has a width of not more than 0.1 μm. The N-face GaN is grown so as to fill the grooves 2a and 2c and so as to be arranged in a stripe pattern substantially parallel to the gate width direction, and each pattern has a thickness of approximately 1 μm from the upper edges of the grooves 2a and 2c and has a width of not more than 0.1 μm. Ga-face GaN layers 3a and N-face GaN layers 3b are grown as described above, and the electron transit layer 3 is formed in a self-organizing manner. The buffer layer 2 and the electron transit layer 3 constitute a layered compound semiconductor structure 10.

Figure 17A:
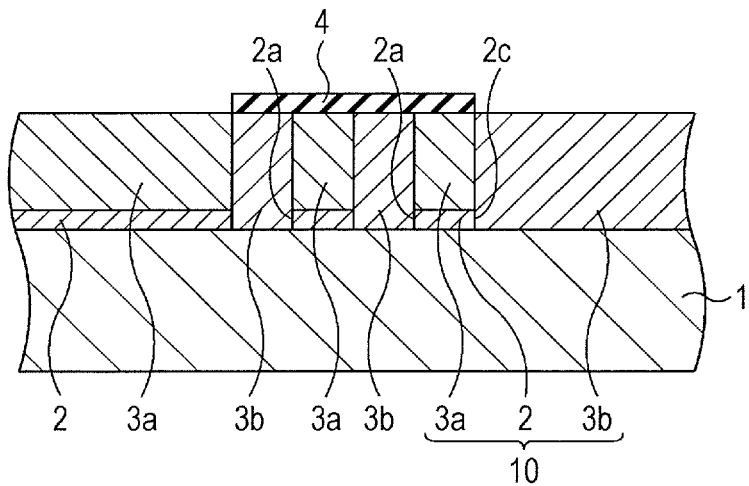
FIGS. 17A to 17C are schematic cross-sectional views illustrating the subsequent processes for manufacturing the GaN-HEMT according to the third embodiment in sequence.

Then, as illustrated in FIG. 17A, a gate insulating film 4 is formed. In particular, an insulating material, such as $SiO_2$, is deposited on the electron transit layer 3. $SiO_2$ is deposited by, for example, a CVD method to a thickness of approximately 40 nm. The deposited $SiO_2$ is processed by lithography and dry etching so as to be left at a position at which a gate electrode is to be formed. The gate insulating film 4 is formed in this manner. In place of SiO$_2$, for instance, SiN, Al$_2$O$_3$, or nitrides or oxynitrides of Al may be deposited.

In this case, Al$_2$O$_3$ may be deposited by, for instance, an ALD method, a plasma CVD method, or a sputtering method. In place of Al$_2$O$_3$, nitrides or oxynitrides of Al may be used. Furthermore, in order to form the gate insulating film 4, oxides, nitrides, or oxynitrides of Si, Hf, Zr, Ti, Ta, or W may be used, or an appropriate combination thereof may be employed to form a multilayered structure.

Figure 17B:
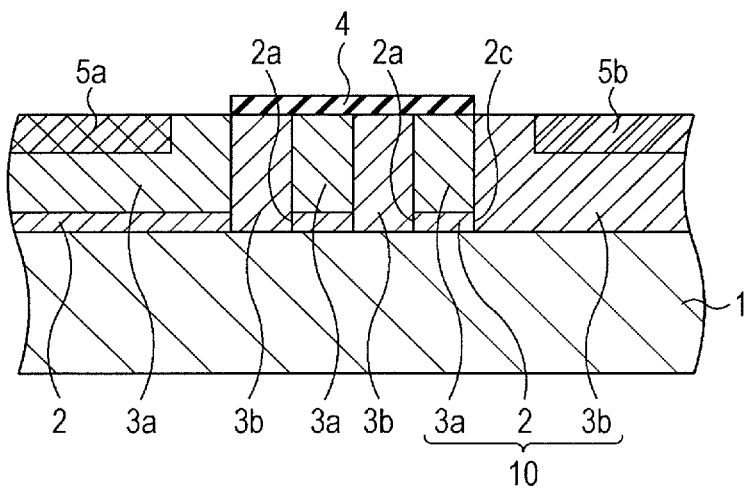

Then, as illustrated in FIG. 17B, impurity diffusion layers 5a and 5b are formed in the electron transit layer 3. In particular, ions of an n-type impurity, such as silicon (Si) in this case, are implanted into parts of the electron transit layer 3 which are positioned on the both sides of the gate insulating film 4 and on which a source electrode and a drain electrode are to be separately formed, the concentration of Si being not less than $1 \times 10^{20}/cm^3$. In this manner, the impurity diffusion layers 5a and 5b are formed in the electron transit layer 3. Since the source electrode is to be formed so as to overlie the Ga-face GaN layer 3a, the impurity diffusion layer 5a is formed in the Ga-face GaN layer 3a. Since the drain electrode is to be formed so as to overlie the N-face GaN layer 3b, the impurity diffusion layer 5b is formed in the N-face GaN layer 3b.

Then, device isolation structure is formed. In particular, for example, argon (Ar) is injected into a device isolation region of the layered compound semiconductor structure 10. In this manner, a device isolation structure is formed on the surfaces of the layered compound semiconductor structure 10 and the Si substrate 1. The device isolation structure defines active regions on the layered compound semiconductor structure 10. The device isolation structure may be formed by, for instance, an STI method instead of the above-mentioned ion implantation. In this case, for example, a chlorine-based etching gas is used for dry etching of the layered compound semiconductor structure 10.

Figure 17C:
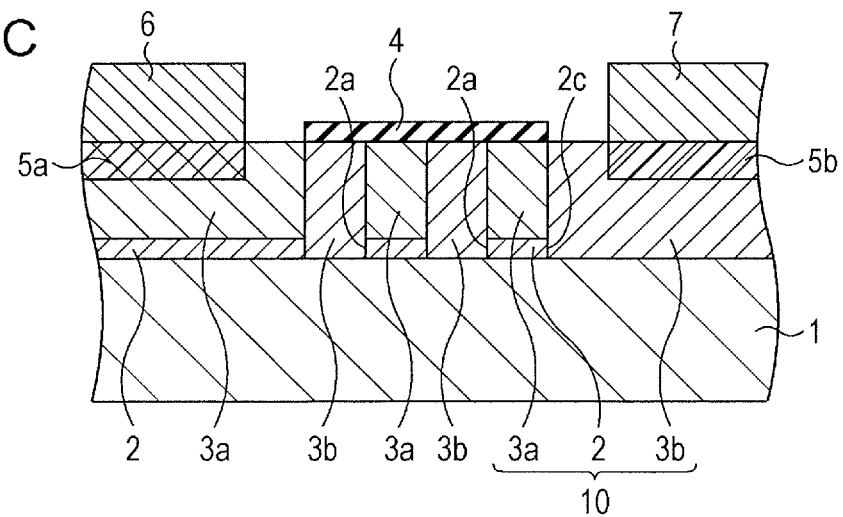

Then, as illustrated in FIG. 17C, a source electrode 6 and a drain electrode 7 are formed. In particular, a resist is applied onto the surfaces of the electron transit layer 3 and gate insulating film 4, and the resist is processed by lithography to form openings in which the impurity diffusion layers 5a and 5b are exposed. In this manner, a resist mask having such openings is formed. An electrode material such as Ti/Al is deposited by, for example, a vapor deposition technique on the resist mask and in the openings in which the impurity diffusion layers 5a and 5b are exposed. Ti is deposited to a thickness of approximately 20 nm, and Al is deposited to a thickness of approximately 200 nm. The resist mask and Ti/Al deposited thereon are removed by a lift-off technique. Then, the Si substrate 1 is annealed, for example, under a nitrogen atmosphere at approximately 400° C. to 1000° C., such as approximately 600° C., and the remaining Ti/Al is brought into ohmic contact with the impurity diffusion layers 5a and 5b. The annealing does not have to be carried out in some cases provided that Ti/Al is brought into ohmic contact with the impurity diffusion layers 5a and 5b. In this manner, the source electrode 6 is formed on the impurity diffusion layer 5a formed in the Ga-face GaN layer 3a, and the drain electrode 7 is formed on the impurity diffusion layer 5b formed in the N-face GaN layer 3b.

Then, as illustrated in FIG. 18A, a gate electrode 8 is formed. In particular, a resist is applied onto the surface of the electron transit layer 3 so as to cover the gate insulating film 4, the source electrode 6, and the drain electrode 7, and then the resist is processed by lithography to form an opening in which the gate insulating film 4 is exposed. In this manner, a resist mask having such an opening is formed. An electrode material such as Ni/Au is deposited on the resist mask and in the gate insulating film 4-exposed opening by, for example, a vapor deposition technique. Ni is deposited to a thickness of approximately 30 nm, and Au is deposited to a thickness of approximately 400 nm. The resist mask and Ni/Au deposited thereon are removed by a lift-off technique. Through this process, the gate electrode 8 is formed on the gate insulating film 4.

Then, as illustrated in FIGS. 18B and 19B, a protective film 9 is formed. In FIG. 19B, illustration of the gate insulating film 4 and gate electrode 8 is omitted. FIG. 18B corresponds to the cross section taken along the dashed line XVIIIB-XVIIIB in FIG. 19B. In particular, an insulating material, such as SiO$_2$, is deposited by, for instance, a CVD method to fill entire spaces between the source electrode 6 and the gate electrode 8 and between the drain electrode 7 and the gate electrode 8. The deposited SiO$_2$ is processed by lithography and dry etching so as to be left between the source electrode 6 and the gate electrode 8 and between the drain electrode 7 and the gate electrode 8. In this manner, the protective film 9 is formed such that the spaces between the source electrode 6 and the gate electrode 8 and between the drain electrode 7 and the gate electrode 8 are filled.

In the third embodiment, as illustrated in FIG. 19B, a direction (alternate direction) A1 in which the Ga-face GaN layers 3a and the N-face GaN layers 3b are alternately arranged in parallel is substantially parallel to a direction A2 in which electric current flows in part of the electron transit layer 3 between the source electrode 6 and the drain electrode 7. As in the first embodiment, the Ga-face GaN layers 3a and N-face GaN layers 3b of the third embodiment each have a width L of not more than 0.1 μm.

Then, manufacturing of the GaN-HEMT of the third embodiment is completed through processes, for example, for providing wiring connected to the source electrode 6, the drain electrode 7, and the gate electrode 8.

As illustrated in FIG. 18B, in the GaN-HEMT of the third embodiment, the multiple Ga-face GaN layers 3a and the multiple N-face GaN layer 3b are alternately arranged below the gate electrode 8 (right under the gate insulating film 4). Owing to spontaneous polarization of GaN, negative spontaneous polarization charges are present in the Ga-face GaN layers 3a in the vicinity of the surfaces thereof, and positive spontaneous polarization charges are present in the N-face GaN layers 3b in the vicinity of the surfaces thereof. This structure enables the charges generated by spontaneous polarization of GaN to be substantially balanced and neutralized right under the gate insulating film 4 as a whole. In this case, even when temperature is changed, a variation in spontaneous polarization charges in the Ga-face GaN layers 3a are substantially the same as a variation in spontaneous polarization charges in the N-face GaN layers 3b. Hence, neutralization of spontaneous polarization charges dissolves the temperature dependence of a threshold voltage and flat band voltage in the GaN-HEMT.

In the GaN-HEMT of the third embodiment, the spontaneous polarization charges under the gate insulating film 4 are neutralized in a state in which a gate voltage is not applied; hence, application of a drain voltage does not lead to the flow of electric current, and thus the transistor is in an off-mode, which enables operation in a normally-off mode. In contrast, in the case where a positive voltage is applied to the gate electrode 8, two-dimensional electron gas (2DEG) is accumulated in the electron transit layer 3 in the vicinity of the interface to the gate insulating film 4, and application of a drain voltage therefore leads to the flow of electric current, so that the transistor enters an on-mode.

Figure 20:
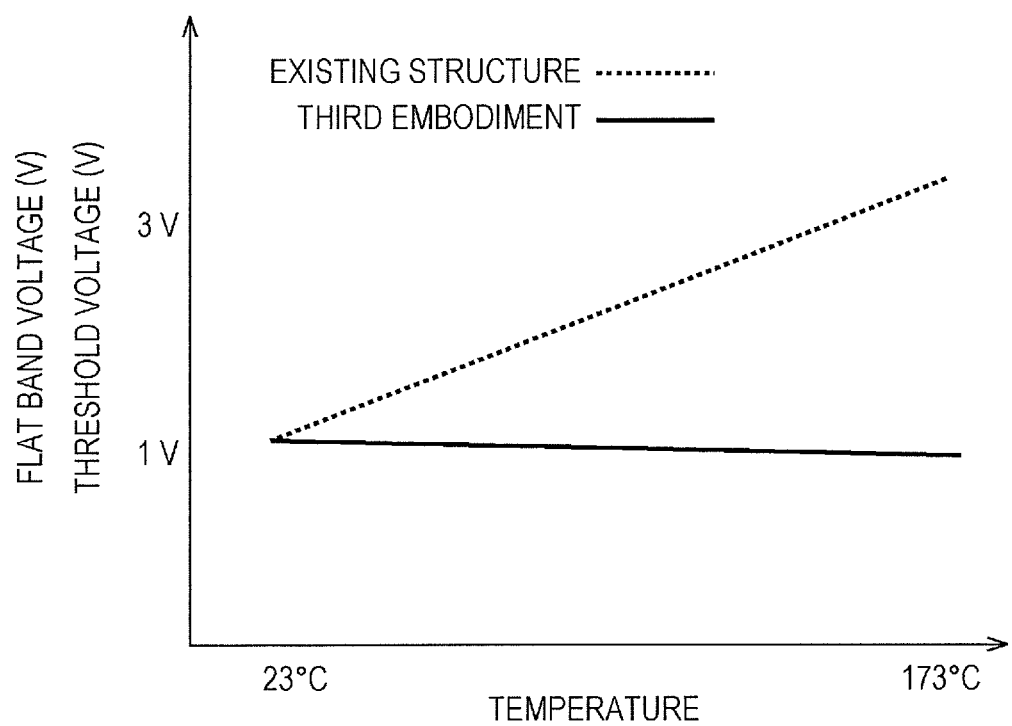
FIG. 20 illustrates result of comparison in temperature dependence of a threshold voltage and flat band voltage between the GaN-HEMT according to the third embodiment and an existing structure.

The temperature dependence of a threshold voltage and flat band voltage in the GaN-HEMT of the third embodiment are compared with that in a GaN-HEMT having the existing structure, and FIG. 20 illustrates the result thereof. In the existing structure, an electron transit layer includes Ga-face GaN alone. As illustrated in FIG. 20, the temperature dependence of a threshold voltage and flat band voltage is 80% to 90% smaller in the GaN-HEMT in which spontaneous polarization charges are neutralized owing to the electron transit layer having the structure of the third embodiment than in a GaN-HEMT having the existing structure.

In the third embodiment, as illustrated in FIG. 18B, the Ga-face GaN layer 3a in which negative spontaneous polarization charges are present underlies the source electrode 6, and the N-face GaN layer 3b in which positive spontaneous polarization charges are present underlies the drain electrode 7. In part of the electron transit layer 3 between the source electrode 6 and the drain electrode 7, 2DEG flows from the source electrode 6 to the drain electrode 7. Hence, the above-mentioned structure increases the amount of 2DEG that flows between the source electrode 6 and the drain electrode 7, which leads to a reduction in on-resistance.

As described above, the GaN-HEMT of the third embodiment enables great reductions in temperature dependence of a threshold voltage and flat band voltage with the result that a threshold voltage and a flat band voltage are well stabilized, enables a reduction in on-resistance, and has high reliability and high breakdown voltage in a normally-off mode.

Fourth Embodiment

Although a fourth embodiment discloses the structure of a GaN-HEMT and a method for manufacturing the GaN-HEMT as in the first embodiment, the fourth embodiment is different from the first embodiment in the structure of the electron transit layer. The same components as used in the first embodiment are denoted by the same reference symbols, and detailed description thereof is omitted. FIGS. 21A to 23B are schematic cross-sectional views illustrating processes for manufacturing the GaN-HEMT according to the fourth embodiment in sequence. FIGS. 24A and 23B are schematic plan views corresponding to FIG. 21C and FIG. 23B, respectively.

Figure 21A:
FIGS. 21A to 21C are schematic cross-sectional views illustrating processes for manufacturing a GaN-HEMT according to a fourth embodiment in sequence.

As illustrated in FIG. 21A, a buffer layer 2 is formed on an Si substrate 1. AlN is grown on the Si substrate 1 to a thickness of approximately 10 nm to 100 nm by, for instance, MOVPE. In the growth of AlN, a mixed gas of TMAl gas and $NH_3$ gas is used as the source gas. The flow rate of the $NH_3$ gas is approximately in the range of 100 ccm to 10 LM. The growth pressure is approximately in the range of 50 Torr to 300 Torr, and the growth temperature is approximately in the range of 1000° C. to 1200° C. The buffer layer 2 is formed under these conditions. In place of MOVPE, MBE or another technique may be used. In the formation of the buffer layer 2, AlGaN may replace AlN, or GaN may be grown at low temperature.

Figure 21B:
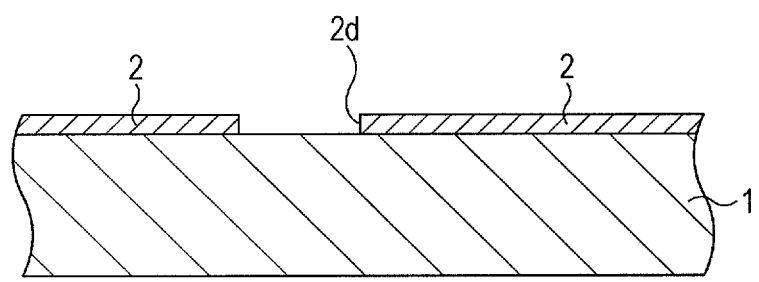

Then, as illustrated in FIG. 21B, grooves 2d are formed in the buffer layer 2. In particular, multiple rectangular grooves 2d are formed in parts of the buffer layer 2 at predetermined intervals in a mosaic pattern so as to have a longitudinal direction substantially orthogonal to the longitudinal direction (gate width direction) of a gate electrode which will be described later, the parts of the buffer layer 2 corresponding to positions at which N-face GaN layers are to be grown. The shorter width of each groove 2d is approximately not more than 0.1 µm. In order to form the grooves 2d, a resist is applied onto the buffer layer 2, and then the resist is processed by lithography to form a resist mask. The buffer layer 2 is dry-etched with the resist mask. In this manner, the grooves 2d are formed in the buffer layer 2 such that the surface of the Si substrate 1 is exposed at the bottoms of the grooves 2d.

Figure 21C:
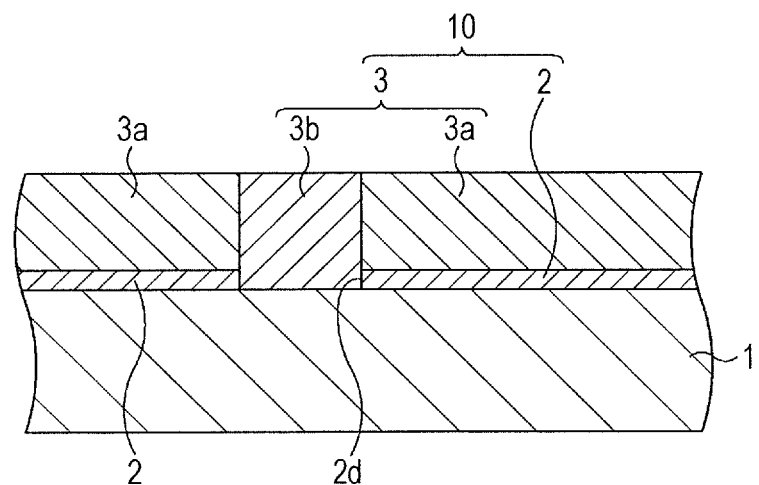

Then, as illustrated in FIGS. 21C and 24A, an electron transit layer 3 is formed so as to cover the buffer layer 2. FIG. 21C corresponds to the cross section taken along the dashed line XXIC-XXIC in FIG. 24A. In particular, GaN is grown by MOVPE to a thickness of approximately 1 µm so as to cover the buffer layer 2. In the growth of GaN, a mixed gas of TMGa gas and $NH_3$ gas is used as the source gas. The flow rate of the $NH_3$ gas is approximately in the range of 100 ccm to 10 LM. The growth pressure is approximately in the range of 50 Torr to 300 Torr, and the growth temperature is approximately in the range of 1000° C. to 1200° C. The electron transit layer 3 is formed under these conditions. In place of MOVPE, MBE or another technique may be used.

GaN grown on the AlN of the buffer layer 2 has a Ga-face, and GaN grown on, for instance, Si has an N-face. In the fourth embodiment, Ga-face GaN is grown on the buffer layer 2, and N-face GaN is grown on the Si substrate 1 exposed at the bottoms of the grooves 2d formed in the buffer layer 2. The Ga-face GaN is grown on the buffer layer 2 to a thickness of approximately 1 µm. In regions between the adjoining grooves 2d, the Ga-face GaN is grown into layers which substantially orthogonally intersect the gate width direction and which have a shorter width of not more than 0.1 µm. The N-face GaN is grown in a rectangular shape so as to fill the grooves 2d and so as to substantially orthogonally intersect the gate width direction, and each rectangular shape has a thickness of approximately 1 µm from the upper edges of the grooves 2d and has a shorter width of not more than 0.1 µm. Ga-face GaN layers 3a and N-face GaN layers 3b are grown as described above, and the electron transit layer 3 is formed in a self-organizing manner. The buffer layer 2 and the electron transit layer 3 constitute a layered compound semiconductor structure 10.

Figure 22A:
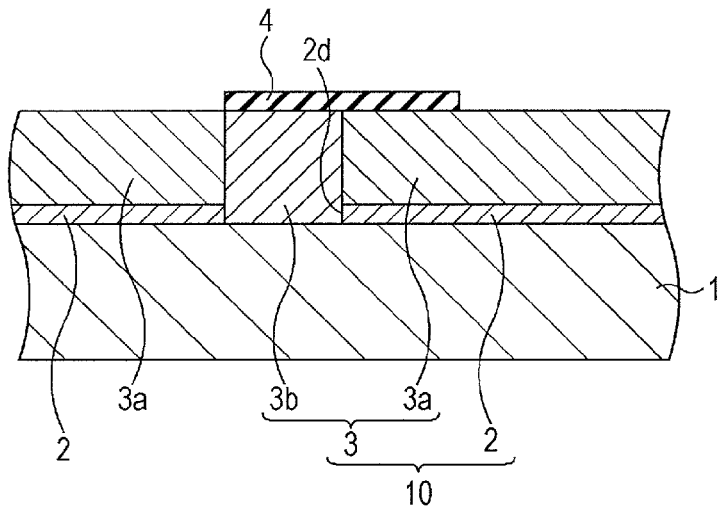
FIGS. 22A to 22C are schematic cross-sectional views illustrating the subsequent processes for manufacturing the GaN-HEMT according to the fourth embodiment in sequence.

Then, as illustrated in FIG. 22A, a gate insulating film 4 is formed. In particular, an insulating material, such as $SiO_2$, is deposited on the electron transit layer 3. $SiO_2$ is deposited by, for example, a CVD method to a thickness of approximately 40 nm. The deposited $SiO_2$ is processed by lithography and dry etching so as to be left at a position at which a gate electrode is to be formed. The gate insulating film 4 is formed in this manner. In place of $SiO_2$, for instance, SiN, $Al_2O_3$, or nitrides or oxynitrides of Al may be deposited.

In this case, $Al_2O_3$ may be deposited by, for instance, an ALD method, a plasma CVD method, or a sputtering method. In place of $Al_2O_3$, nitrides or oxynitrides of Al may be used. Furthermore, in order to form the gate insulating film 4, oxides, nitrides, or oxynitrides of Si, Hf, Zr, Ti, Ta, or W may be used, or an appropriate combination thereof may be employed to form a multilayered structure.

Figure 22B:
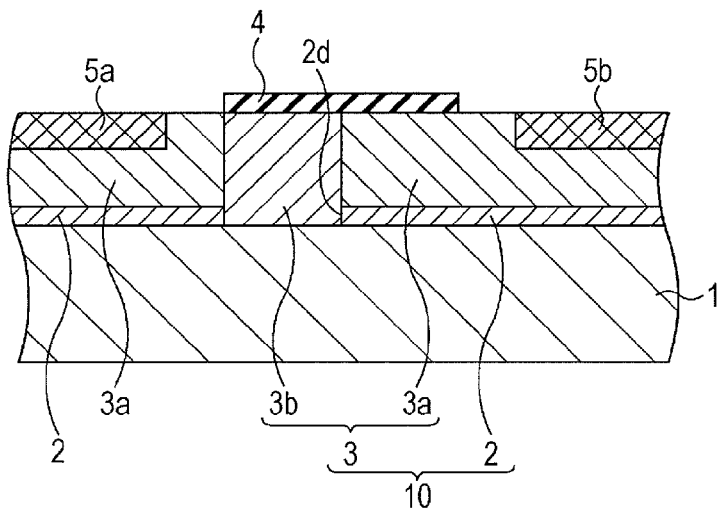

Then, as illustrated in FIG. 22B, impurity diffusion layers 5a and 5b are formed in the electron transit layer 3. In particular, ions of an n-type impurity, such as silicon (Si) in this case, are implanted into parts of the electron transit layer 3 which are positioned on the both sides of the gate insulating film 4 and on which a source electrode and a drain electrode are to be separately formed, the concentration of Si being not less than $1 \times 10^{20}/cm^3$. In this manner, the impurity diffusion layers 5a and 5b are formed in the electron transit layer 3.

Then, device isolation structure is formed. In particular, for example, argon (Ar) is injected into a device isolation region of the layered compound semiconductor structure 10. In this manner, a device isolation structure is formed on the surfaces of the layered compound semiconductor structure 10 and the Si substrate 1. The device isolation structure defines active regions on the layered compound semiconductor structure 10. The device isolation structure may be formed by, for instance, an STI method instead of the above-mentioned ion implantation. In this case, for example, a chlorine-based etching gas is used for dry etching of the layered compound semiconductor structure 10.

Figure 22C:
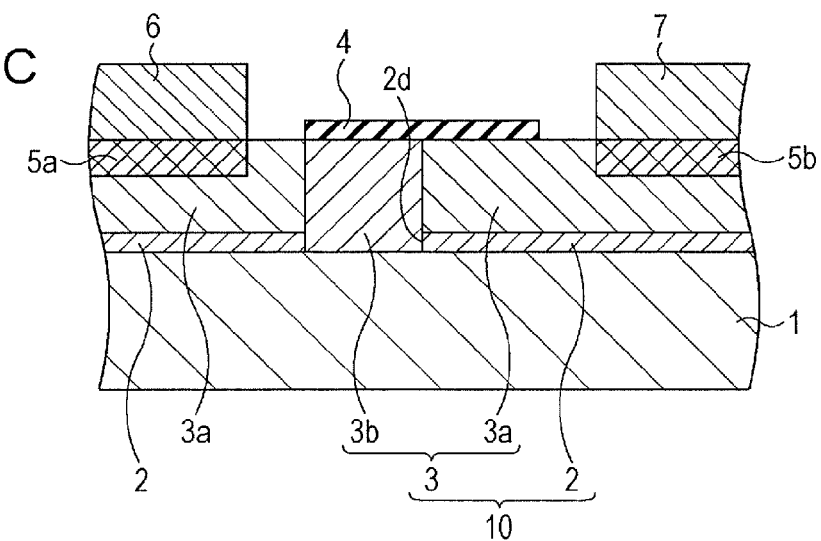

Then, as illustrated in FIG. 22C, a source electrode 6 and a drain electrode 7 are formed. In particular, a resist is applied onto the surfaces of the electron transit layer 3 and gate insulating film 4, and the resist is processed by lithography to form openings in which the impurity diffusion layers 5a and 5b are exposed. In this manner, a resist mask having such openings is formed. An electrode material such as Ti/Al is deposited by, for example, a vapor deposition technique on the resist mask and in the openings in which the impurity diffusion layers 5a and 5b are exposed. Ti is deposited to a thickness of approximately 20 nm, and Al is deposited to a thickness of approximately 200 nm. The resist mask and Ti/Al deposited thereon are removed by a lift-off technique. Then, the Si substrate 1 is annealed, for example, under a nitrogen atmosphere at approximately 400° C. to 1000° C., such as approximately 600° C., and the remaining Ti/Al is brought into ohmic contact with the impurity diffusion layers 5a and 5b. The annealing does not have to be carried out in some cases provided that Ti/Al is brought into ohmic contact with the impurity diffusion layers 5a and 5b. In this manner, the source electrode 6 and the drain electrodes 7 are formed on the impurity diffusion layers 5a and 5b, respectively.

Figure 23A:
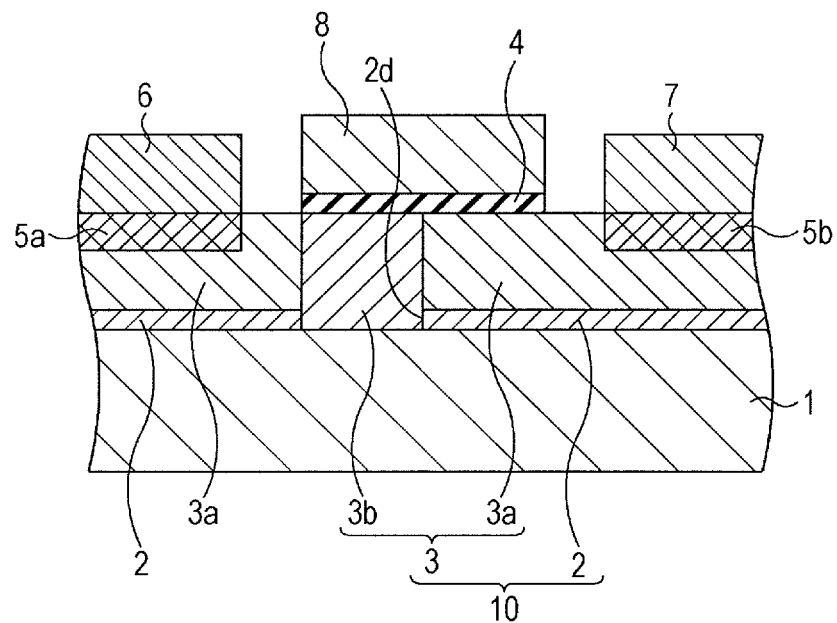
FIGS. 23A and 23B are schematic cross-sectional views illustrating the subsequent processes for manufacturing the GaN-HEMT according to the fourth embodiment in sequence.
Figure 23B:
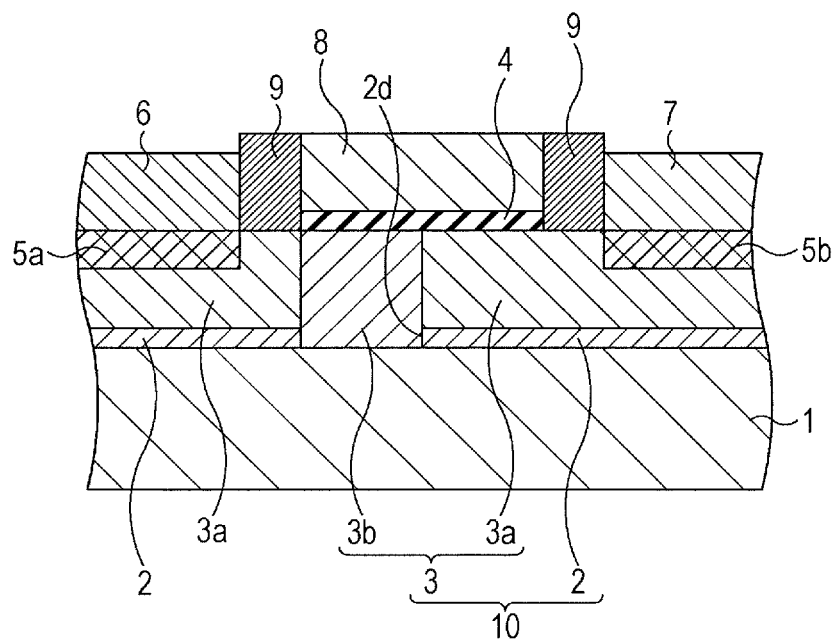
Figure 24A:
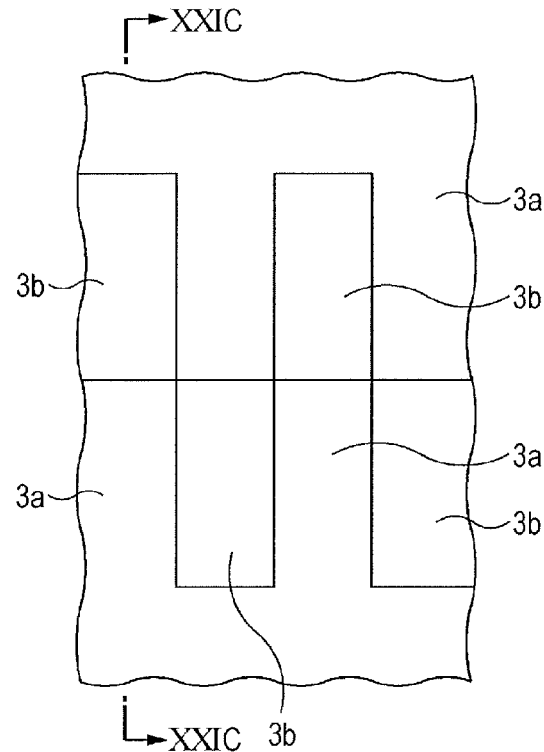
FIGS. 24A and 24B are schematic plan views illustrating the processes for manufacturing the GaN-HEMT according to the fourth embodiment.

Then, as illustrated in FIG. 23A, a gate electrode 8 is formed. In particular, a resist is applied onto the surface of the electron transit layer 3 so as to cover the gate insulating film 4, the source electrode 6, and the drain electrode 7, and then the resist is processed by lithography to form an opening in which the gate insulating film 4 is exposed. In this manner, a resist mask having such an opening is formed. An electrode material such as Ni/Au is deposited on the resist mask and in the gate insulating film 4-exposed opening by, for example, a vapor deposition technique. Ni is deposited to a thickness of approximately 30 nm, and Au is deposited to a thickness of approximately 400 nm. The resist mask and Ni/Au deposited thereon are removed by a lift-off technique. Through this process, the gate electrode 8 is formed on the gate insulating film 4.

Figure 24B:
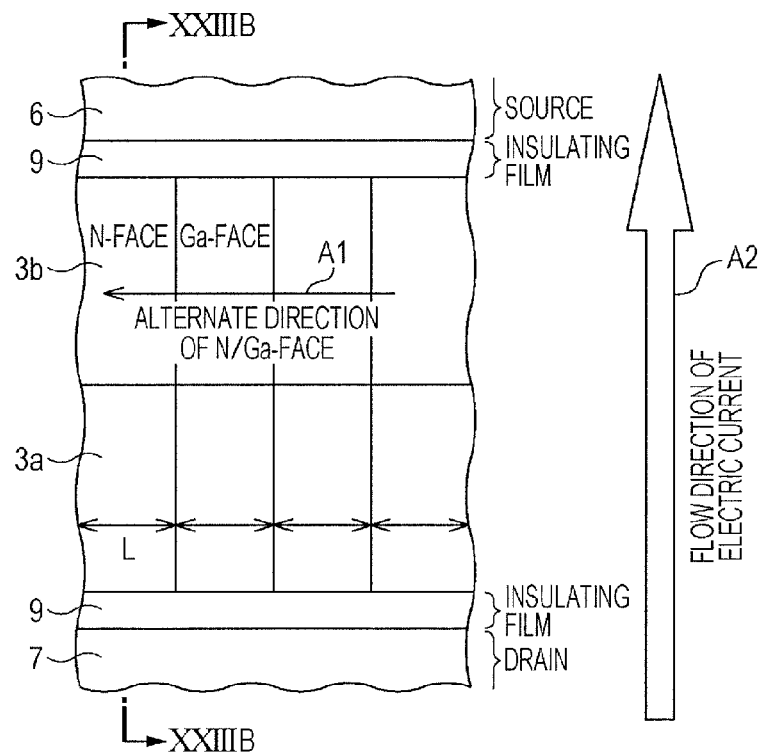

Then, as illustrated in FIGS. 23B and 24B, a protective film 9 is formed. In FIG. 24B, illustration of the gate insulating film 4 and gate electrode 8 is omitted. FIG. 23B corresponds to the cross section taken along the dashed line XXIIIB-XXIIIB in FIG. 24B. In particular, an insulating material, such as $SiO_2$, is deposited by, for instance, a CVD method to fill entire spaces between the source electrode 6 and the gate electrode 8 and between the drain electrode 7 and the gate electrode 8. The deposited $SiO_2$ is processed by lithography and dry etching so as to be left between the source electrode 6 and the gate electrode 8 and between the drain electrode 7 and the gate electrode 8. In this manner, the protective film 9 is formed such that the spaces between the source electrode 6 and the gate electrode 8 and between the drain electrode 7 and the gate electrode 8 are filled.

In the fourth embodiment, as illustrated in FIG. 24B, the rectangular Ga-face GaN layers 3a and the rectangular N-face GaN layers 3b are alternately arranged in a mosaic pattern below the gate electrode 8 (right under the gate insulating film 4). A direction (alternate direction) A1 in which the Ga-face GaN layers 3a and the N-face GaN layers 3b are alternately arranged in parallel is substantially orthogonal to a direction A2 in which electric current flows in part of the electron transit layer 3 between the source electrode 6 and the drain electrode 7. As in the first embodiment, the Ga-face GaN layers 3a and N-face GaN layers 3b of the fourth embodiment each have a shorter width L of not more than 0.1 μm.

Then, manufacturing of the GaN-HEMT of the fourth embodiment is completed through processes, for example, for providing wiring connected to the source electrode 6, the drain electrode 7, and the gate electrode 8.

As illustrated in FIG. 24B, in the GaN-HEMT of the fourth embodiment, the multiple Ga-face GaN layers 3a and the multiple N-face GaN layer 3b are alternately arranged in a mosaic pattern below the gate electrode 8 (right under the gate insulating film 4). Owing to spontaneous polarization of GaN, negative spontaneous polarization charges are present in the Ga-face GaN layers 3a in the vicinity of the surfaces thereof, and positive spontaneous polarization charges are present in the N-face GaN layers 3b in the vicinity of the surfaces thereof. This structure enables the charges generated by spontaneous polarization of GaN to be substantially balanced and neutralized right under the gate insulating film 4 as a whole. In the fourth embodiment, the Ga-face GaN layers 3a and the N-face GaN layer 3b are alternately arranged in a mosaic pattern, and both Ga polarity and N polarity are therefore present in a narrow region; thus, spontaneous polarization charges are neutralized further in a well-balanced manner. In this case, even when temperature is changed, a variation in spontaneous polarization charges in the Ga-face GaN layers 3a are substantially the same as a variation in spontaneous polarization charges in the N-face GaN layers 3b. Hence, neutralization of spontaneous polarization charges dissolves the temperature dependence of a threshold voltage and flat band voltage in the GaN-HEMT.

In the GaN-HEMT of the fourth embodiment, the spontaneous polarization charges under the gate insulating film 4 are neutralized in a state in which a gate voltage is not applied; hence, application of a drain voltage does not lead to the flow of electric current, and thus the transistor is in an off-mode, which enables operation in a normally-off mode. In contrast, in the case where a positive voltage is applied to the gate electrode 8, two-dimensional electron gas (2DEG) is accumulated in the electron transit layer 3 in the vicinity of the interface to the gate insulating film 4, and application of a drain voltage therefore leads to the flow of electric current, so that the transistor enters an on-mode.

Figure 25:
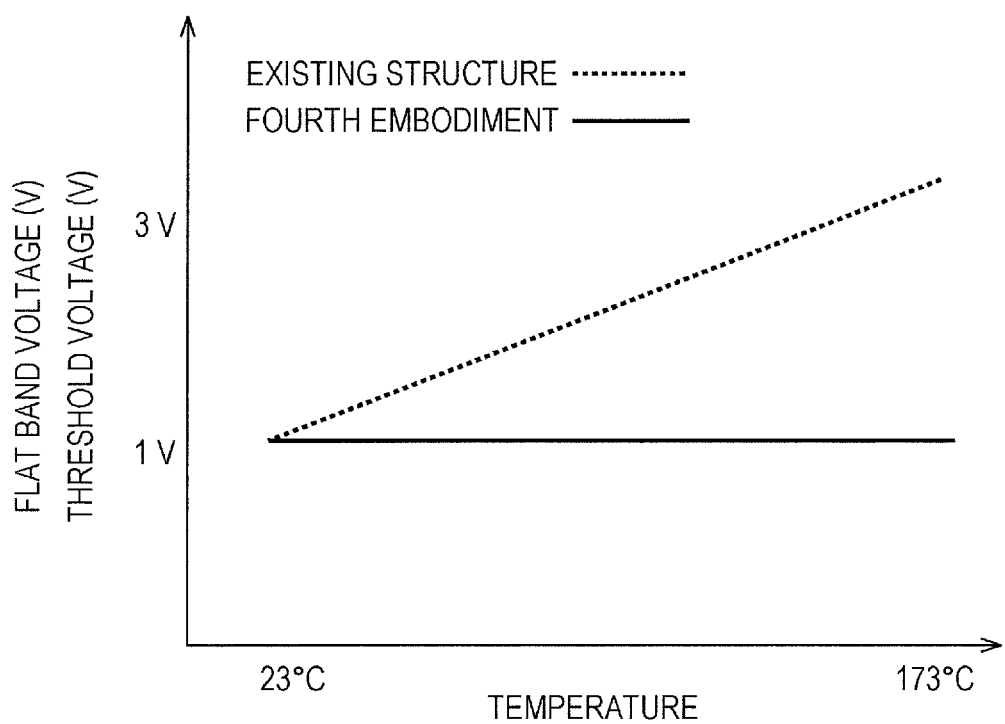
FIG. 25 illustrates result of comparison in temperature dependence of a threshold voltage and flat band voltage between the GaN-HEMT according to the fourth embodiment and an existing structure.

The temperature dependence of a threshold voltage and flat band voltage in the GaN-HEMT of the fourth embodiment are compared with that in a GaN-HEMT having the existing structure, and FIG. 25 illustrates the result thereof. In the existing structure, an electron transit layer includes Ga-face GaN alone. As illustrated in FIG. 25, the temperature dependence of a threshold voltage and flat band voltage is at least 90% smaller in the GaN-HEMT in which spontaneous polarization charges are neutralized owing to the electron transit layer having the structure of the fourth embodiment than in a GaN-HEMT having the existing structure.

In the fourth embodiment, as illustrated in FIG. 24B, the alternate direction A1 in which the Ga-face GaN layers 3a and the N-face GaN layers 3b are arranged in a mosaic pattern is substantially orthogonal to a direction A2 in which electric current flows in part of the electron transit layer 3 between the source electrode 6 and the drain electrode 7. In this case, even when electric potential is changed by the spontaneous polarization charges of the Ga-face GaN layers 3a and N-face GaN layers 3b, which have opposite polarity to each other, 2DEG which moves between the source electrode 6 and the drain electrode 7 is not scattered. Hence, on-resistance is decreased without mobility degradation.

As described above, the GaN-HEMT of the fourth embodiment enables great reductions in temperature dependence of a threshold voltage and flat band voltage with the result that a threshold voltage and a flat band voltage are well stabilized, enables a reduction in on-resistance, and has high reliability and high breakdown voltage in a normally-off mode.

The first to fourth embodiments may be appropriately combined. The third embodiment, for example, may be combined with the fourth embodiment. In this case, the GaN layers 3a and N-face GaN layers 3b are alternately arranged in a mosaic pattern below the gate electrode 8. The source electrode 6 is formed on the impurity diffusion layer 5a formed in the Ga-face GaN layer 3a, and the drain electrode 7 is formed on the impurity diffusion layer 5b formed in the N-face GaN layer 3b.

In each of the first to fourth embodiments, the GaN-HEMT has been described as an example of a compound semiconductor device. Instead of GaN-HEMTs, compound semiconductor devices to which these embodiments are applied may be HEMTs in which, for example, AlN is used in place of GaN to form electron transit layers. Also in this case, as in the first to fourth embodiments, such HEMTs enable great reductions in temperature dependence of a threshold voltage and flat band voltage with the result that a threshold voltage and a flat band voltage are well stabilized, enable a reduction in on-resistance, and have high reliability and high breakdown voltage in a normally-off mode.

Fifth Embodiment

Figure 26:
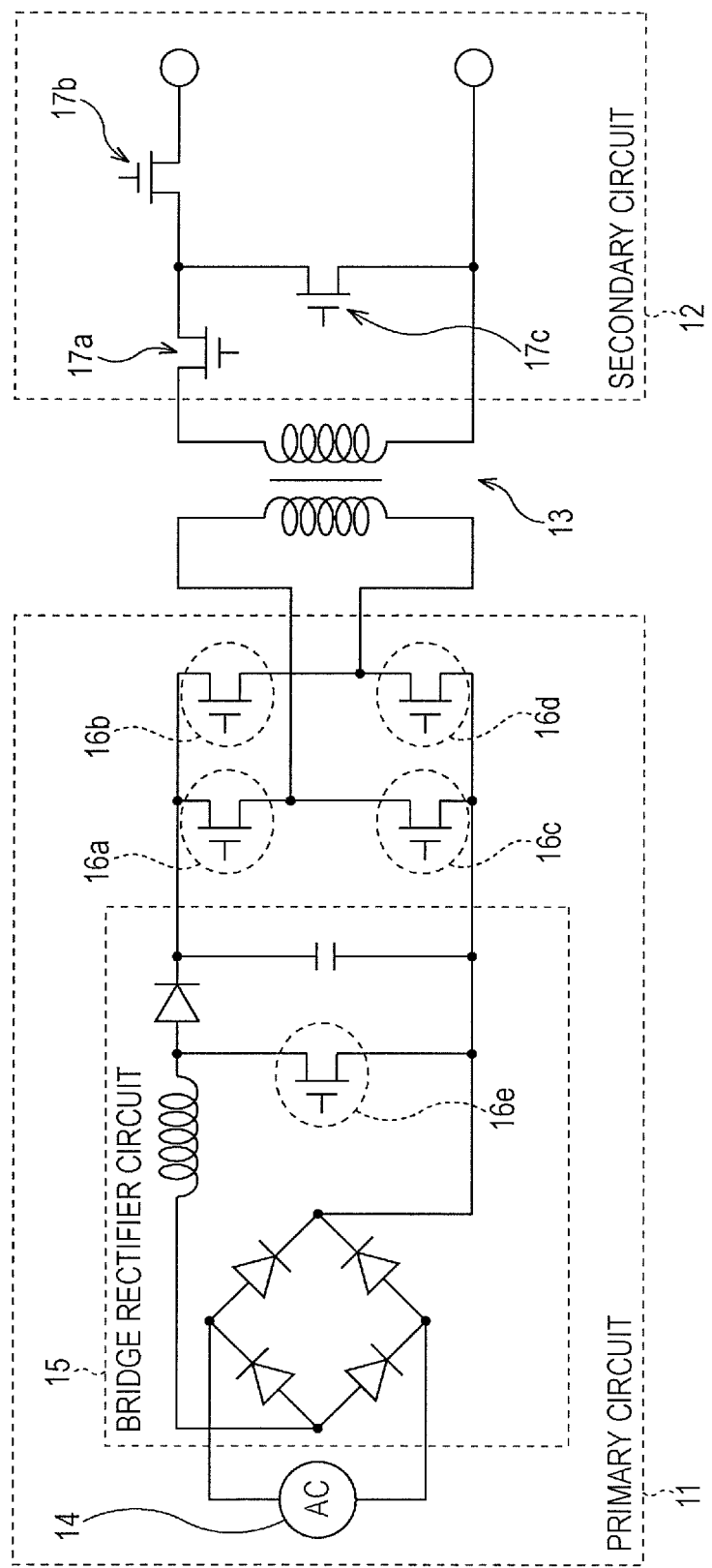
FIG. 26 is a schematic diagram illustrating the general configuration of power supply equipment according to a fifth embodiment.

A fifth embodiment discloses power supply equipment to which a GaN-HEMT selected from those of the first to fourth embodiments is applied. FIG. 26 is a schematic diagram illustrating the general configuration of the power supply equipment according to the fifth embodiment.

The power supply equipment of the fifth embodiment includes a high-tension primary circuit 11, a low-tension secondary circuit 12, and a transformer 13 provided between the primary circuit 11 and the secondary circuit 12. The primary circuit 11 includes an alternating-current power supply 14, a bridge rectifier circuit 15, and multiple (four in the fifth embodiment) switching devices 16a, 16b, 16c, and 16d. The bridge rectifier circuit 15 includes a switching device 16e. The secondary circuit 12 includes multiple (three in the fifth embodiment) switching devices 17a, 17b, and 17c.

In the fifth embodiment, a GaN-HEMT selected from those of the first to fourth embodiments is employed in each of the switching devices 16a, 16b, 16c, 16d, and 16e of the primary circuit 11. In contrast, an existing MIS field effect transistor (FET) using silicon is employed in each of the switching devices 17a, 17b, and 17c of the secondary circuit 12.

In the fifth embodiment, a GaN-HEMT is applied to a high-tension circuit, the GaN-HEMT enabling great reductions in temperature dependence of a threshold voltage and flat band voltage with the result that a threshold voltage and a flat band voltage are well stabilized, enabling a reduction in on-resistance, and having high reliability and high breakdown voltage in a normally-off mode. This configuration enables a power supply circuit having high reliability and exhibiting high power.

Sixth Embodiment

Figure 27:
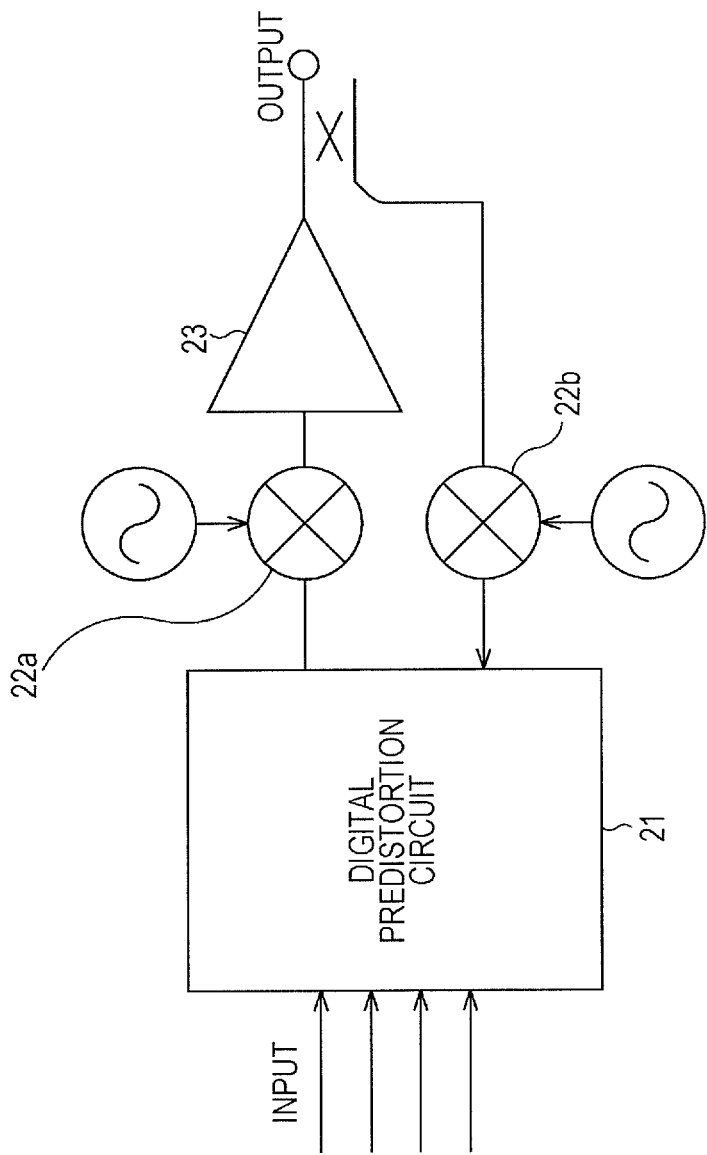
FIG. 27 is a schematic diagram illustrating the general configuration of a high-frequency amplifier according to a sixth embodiment.

A sixth embodiment discloses a high-frequency amplifier to which a GaN-HEMT selected from those of the first to fourth embodiments is applied. FIG. 27 is a schematic diagram illustrating the general configuration of the high-frequency amplifier according to the sixth embodiment.

The high-frequency amplifier of the sixth embodiment includes a digital predistortion circuit 21, mixers 22a and 22b, and a power amplifier 23. The digital predistortion circuit 21 compensates for the nonlinear distortions of input signals. The mixer 22a mixes the input signals subjected to compensation for nonlinear distortions with alternating current signals. The power amplifier 23 amplifies the input signals mixed with the alternating current signals and includes a GaN-HEMT selected from those of the first to fourth embodiments. In the configuration illustrated in FIG. 27, for example, switching operation allows the mixer 22b to mix output signals with alternating current signals and then transmit the mixed signals to the digital predistortion circuit 21.

In the sixth embodiment, a GaN-HEMT is applied to a high-frequency amplifier, the GaN-HEMT enabling great reductions in temperature dependence of a threshold voltage and flat band voltage with the result that a threshold voltage and a flat band voltage are well stabilized, enabling a reduction in on-resistance, and having high reliability and high breakdown voltage in a normally-off mode. This configuration enables a high-frequency amplifier having high reliability and high breakdown voltage.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor, comprising:
   an electron transit layer formed of a compound semiconductor;
   an insulating film formed on the electron transit layer; and
   an electrode formed so as to overlie the electron transit layer,
   wherein the insulating film is interposed between the electron transit layer and the electrode,
   wherein part of the electron transit layer below the electrode is formed such that a first compound semiconductor having a first polar face and a second compound semiconductor having a second polar face different than the first polar face, wherein the first and second compound semiconductors are alternately arranged,
   wherein the insulating film is in direct contact with at least two portions of the first compound semiconductor having the first polar face and at least one portion of the second compound semiconductor having the second polar face, and
   wherein polarization charges in the first polar face have opposite polarity to polarization charges in the second polar face.

2. The compound semiconductor device according to claim 1, wherein the first compound semiconductor and the second compound semiconductor are alternately arranged in parallel in a stripe pattern in plan view.

3. The compound semiconductor device according to claim 1, wherein the first compound semiconductor and the second compound semiconductor are alternately arranged in a mosaic pattern in plan view.

4. The compound semiconductor device according to claim 1, wherein part of the electron transit layer positioned on one side of the electrode is formed of the first compound semiconductor and has a surface that is the first polar face, and part of the electron transit layer positioned on the other side of the electrode is formed of the second compound semiconductor and has a surface that is the second polar face.

5. The compound semiconductor device according to claim 1, wherein a direction in which the first compound semiconductor and the second compound semiconductor are alternately arranged in parallel is not parallel to a direction in which electric current flows in part of the electron transit layer below the electrode.

6. A method for manufacturing a compound semiconductor device, comprising the steps of:
   forming an electron transit layer formed of a compound semiconductor;
   forming an insulating film on the electron transit layer; and
   forming an electrode formed so as to overlie the electron transit layer, wherein the insulating film is interposed between the electron transit layer and the electrode,
   wherein part of the electron transit layer below the electrode is formed such that a first compound semiconductor having a first polar face and a second compound semiconductor having a second polar face different than the first polar face, wherein the first and second compound semiconductors are alternately arranged,
   wherein the insulating film is in direct contact with at least two portions of the first compound semiconductor having the first polar face and at least one portion of the second compound semiconductor having the second polar face, and
   wherein polarization charges in the first polar face have opposite polarity to polarization charges in the second polar face.

7. The method according to claim 6, wherein the first compound semiconductor and the second compound semiconductor are alternately arranged in parallel in a stripe pattern in plan view.

8. The method according to claim 6, wherein the first compound semiconductor and the second compound semiconductor are alternately arranged in a mosaic pattern in plan view.

9. The method according to claim 6, wherein part of the electron transit layer positioned on one side of the electrode is formed of the first compound semiconductor and has a surface that is the first polar face, and part of the electron transit layer positioned on the other side of the electrode is formed of the second compound semiconductor and has a surface that is the second polar face.

10. The method according to claim 6, wherein a direction in which the first compound semiconductor and the second compound semiconductor are alternately arranged in parallel is not parallel to a direction in which electric current flows in part of the electron transit layer below the electrode.

* * * * *